(12) United States Patent
Kim et al.

(10) Patent No.: US 8,587,994 B2
(45) Date of Patent: Nov. 19, 2013

(54) SYSTEM AND METHOD FOR SHARED SENSING MRAM

(75) Inventors: Jung Pill Kim, San Diego, CA (US); Tae Hyun Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 173 days.

(21) Appl. No.: 13/177,992

(22) Filed: Jul. 7, 2011

(65) Prior Publication Data

US 2012/0057400 A1 Mar. 8, 2012

Related U.S. Application Data

(60) Provisional application No. 61/380,832, filed on Sep. 8, 2010.

(51) Int. Cl.
*G11C 11/00* (2006.01)
*G11C 7/02* (2006.01)

(52) U.S. Cl.
USPC .... 365/158; 365/209; 365/210.1; 365/210.14

(58) Field of Classification Search
USPC .......................................................... 365/158
See application file for complete search history.

(56) References Cited

U.S. PATENT DOCUMENTS

| | | | |
|---|---|---|---|
| 6,269,040 B1 * | 7/2001 | Reohr et al. | 365/210.1 |
| 7,167,389 B2 * | 1/2007 | Iwata | 365/158 |
| 7,321,507 B2 * | 1/2008 | Yang et al. | 365/158 |
| 7,539,068 B2 * | 5/2009 | Wang et al. | 365/189.06 |
| 7,952,916 B2 * | 5/2011 | Maeda et al. | 365/158 |
| 8,023,311 B2 * | 9/2011 | Kim et al. | 365/148 |
| 8,059,480 B2 * | 11/2011 | Lee et al. | 365/209 |
| 8,194,439 B2 * | 6/2012 | Kim et al. | 365/158 |
| 2005/0195627 A1 * | 9/2005 | Hutchens et al. | 365/7 |
| 2009/0201717 A1 | 8/2009 | Maeda et al. | |
| 2010/0195382 A1 | 8/2010 | Hidaka | |

OTHER PUBLICATIONS

Bette A., et al: "A high-speed 128kbit mram core for future universal memory applications", 2003 Symposium on VLSI Circuits. Digest of Technical Papers. Kyoto, Japan, Jun. 12-14, 2003; [Symposium on VLSI Circuits], New York, NY : IEEE, US, Jun. 12, 2003, pp. 217-220, XP010651650, DOI: 10.1109/VLSIC.2003.1221207 ISBN: 978-4-89114-034-2 Symmetrical High-Speed Sensing Concept, pp. 218-219 figure 5.
International Search Report and Written Opinion—PCT/US2011/050779—ISA/EPO—Nov. 21, 2011.

* cited by examiner

*Primary Examiner* — Son Mai
(74) *Attorney, Agent, or Firm* — Sam Talpalatsky; Nicholas J. Pauley; Joseph Agusta

(57) ABSTRACT

Resistance memory cells of MRAM arrays are designated as reference cells and programmed to binary 0 and binary 1 states, reference cells from one MRAM array at binary 0 and at binary 1 are concurrently accessed to obtain a reference voltage to read resistance memory cells of another MRAM array, reference cells from the other MRAM array at binary 0 and binary 1 are concurrently accessed to obtain a reference voltage to read resistance memory cells of the one MRAM array.

40 Claims, 9 Drawing Sheets

PRIOR ART
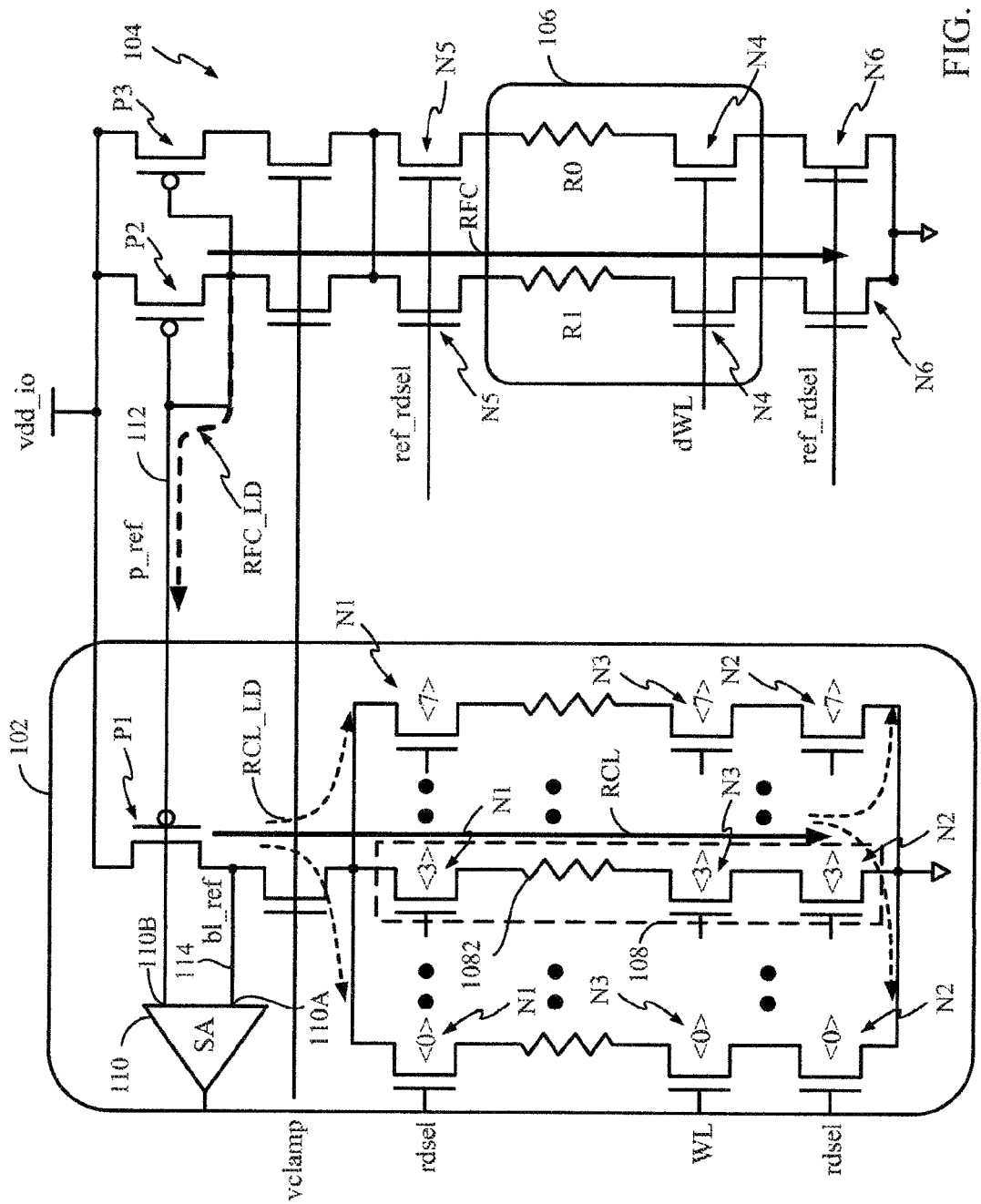
FIG. 1

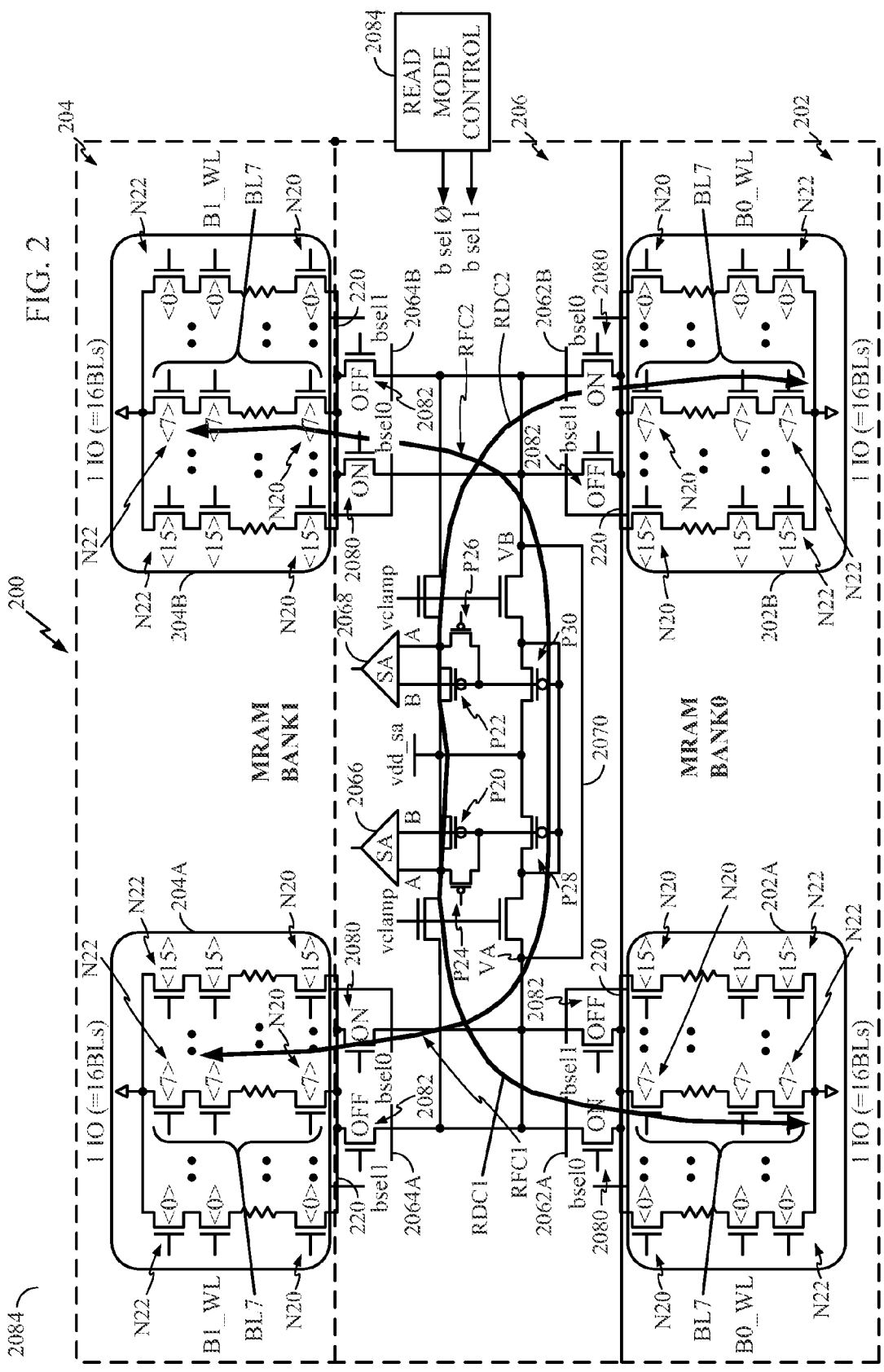
FIG. 2

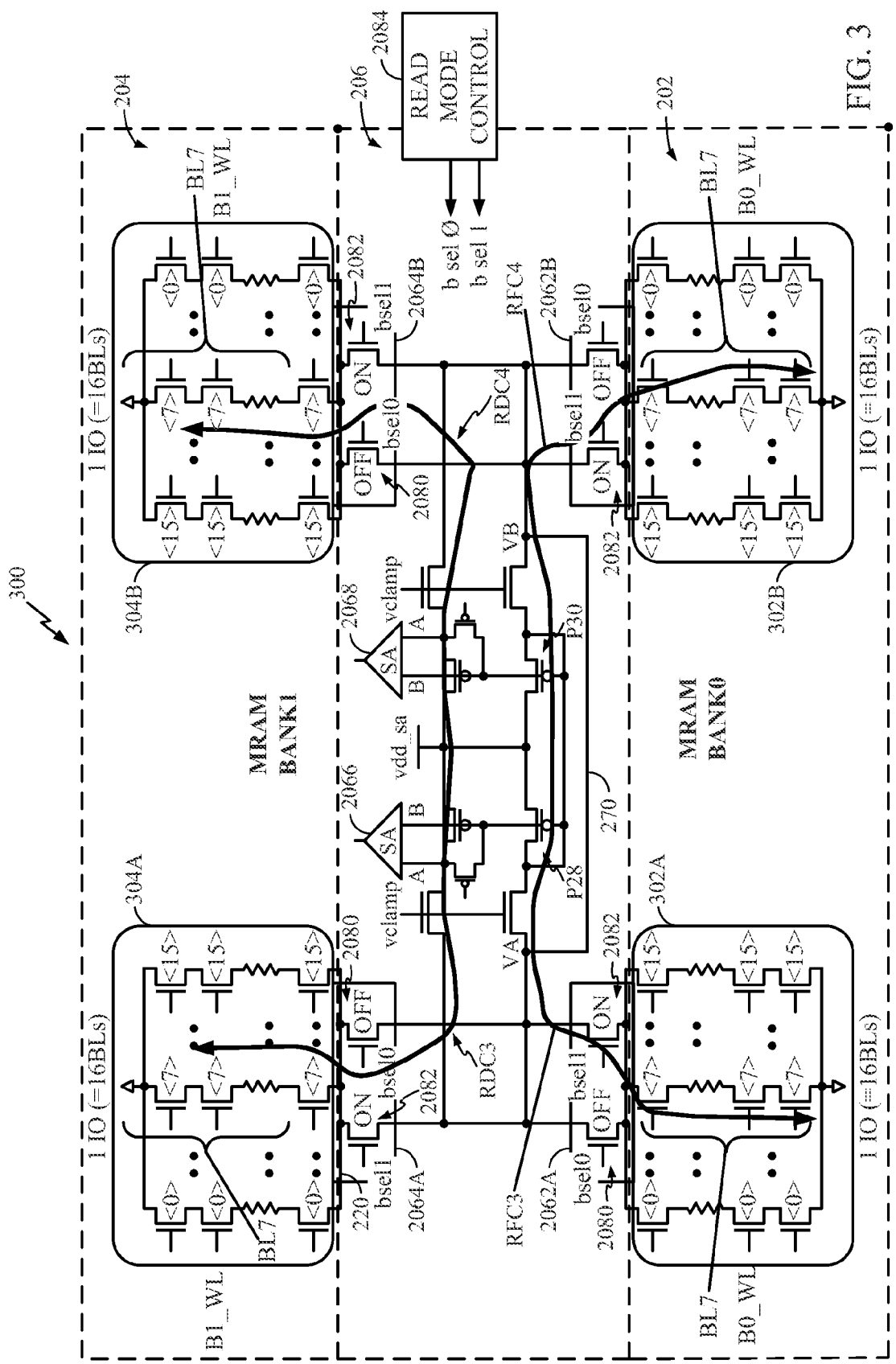
FIG. 3

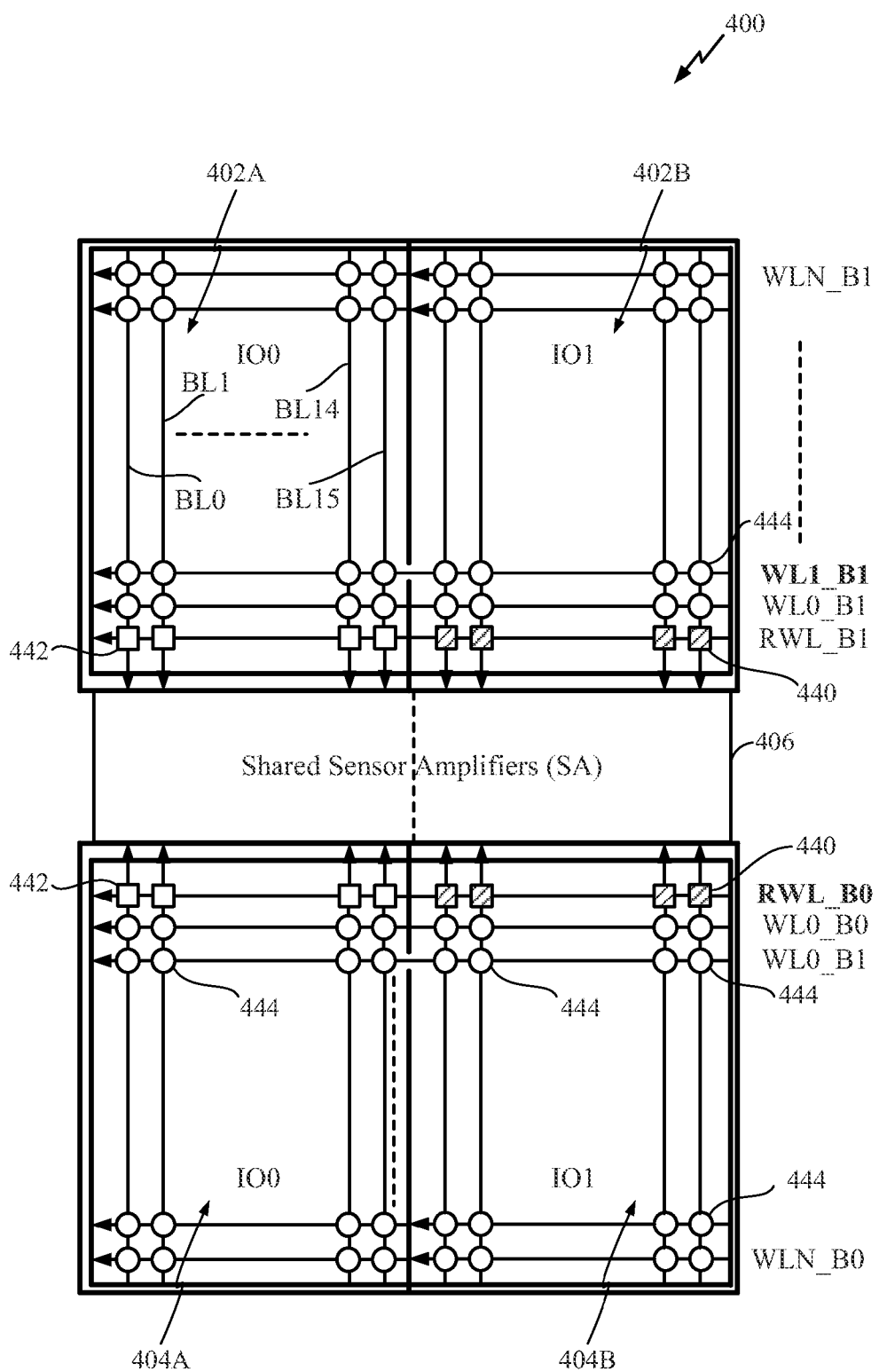
FIG. 4

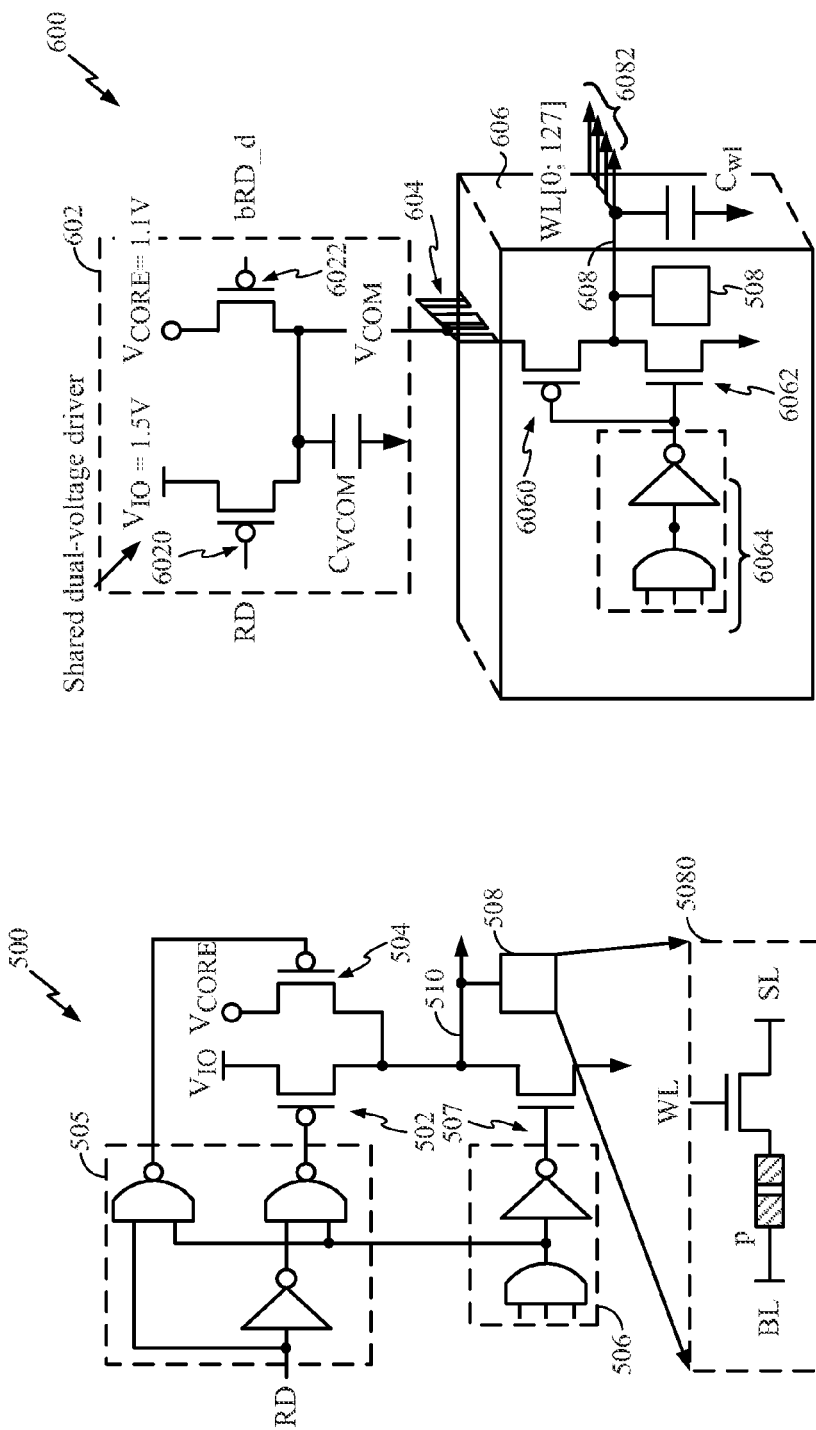
FIG. 6
(RELATED ART)
FIG. 5

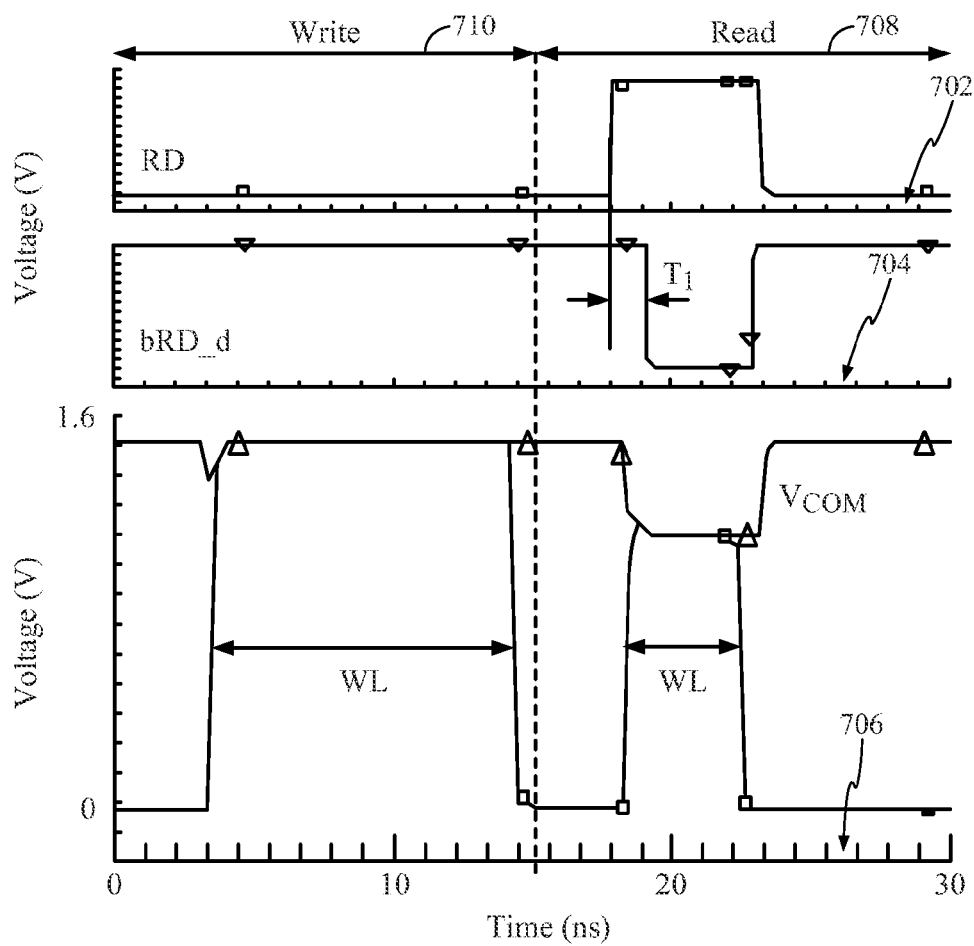
FIG. 7

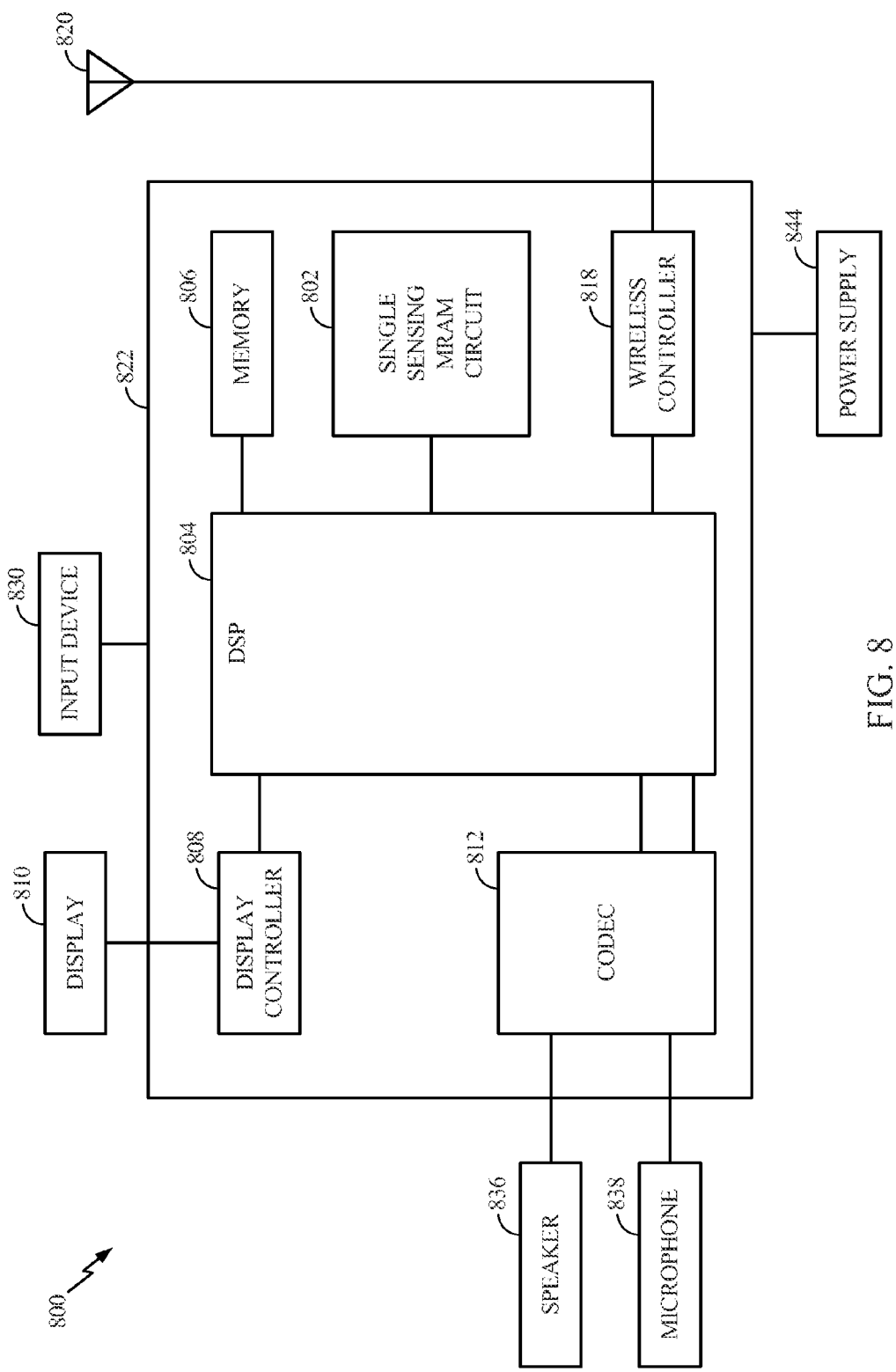
FIG. 8

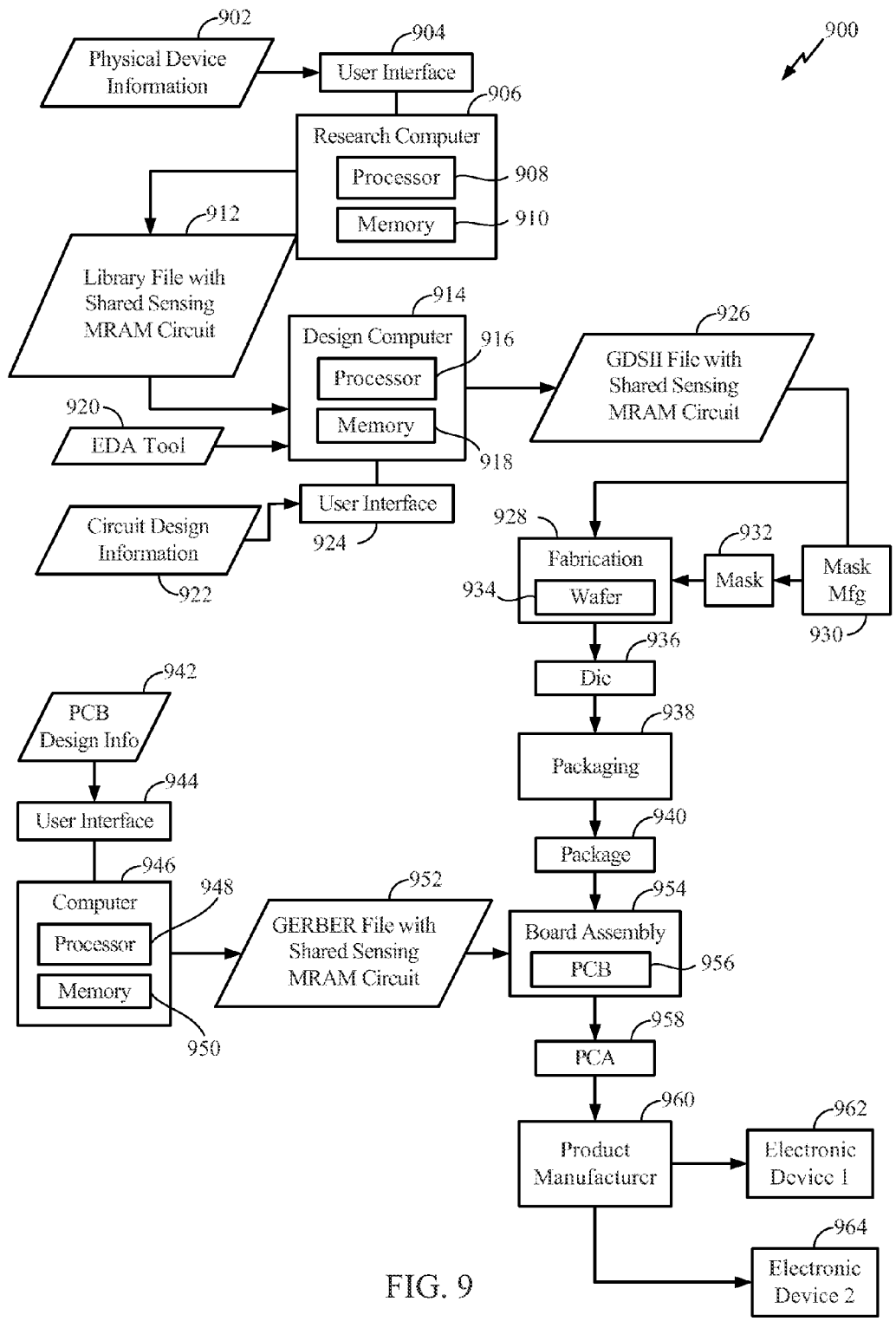
FIG. 9

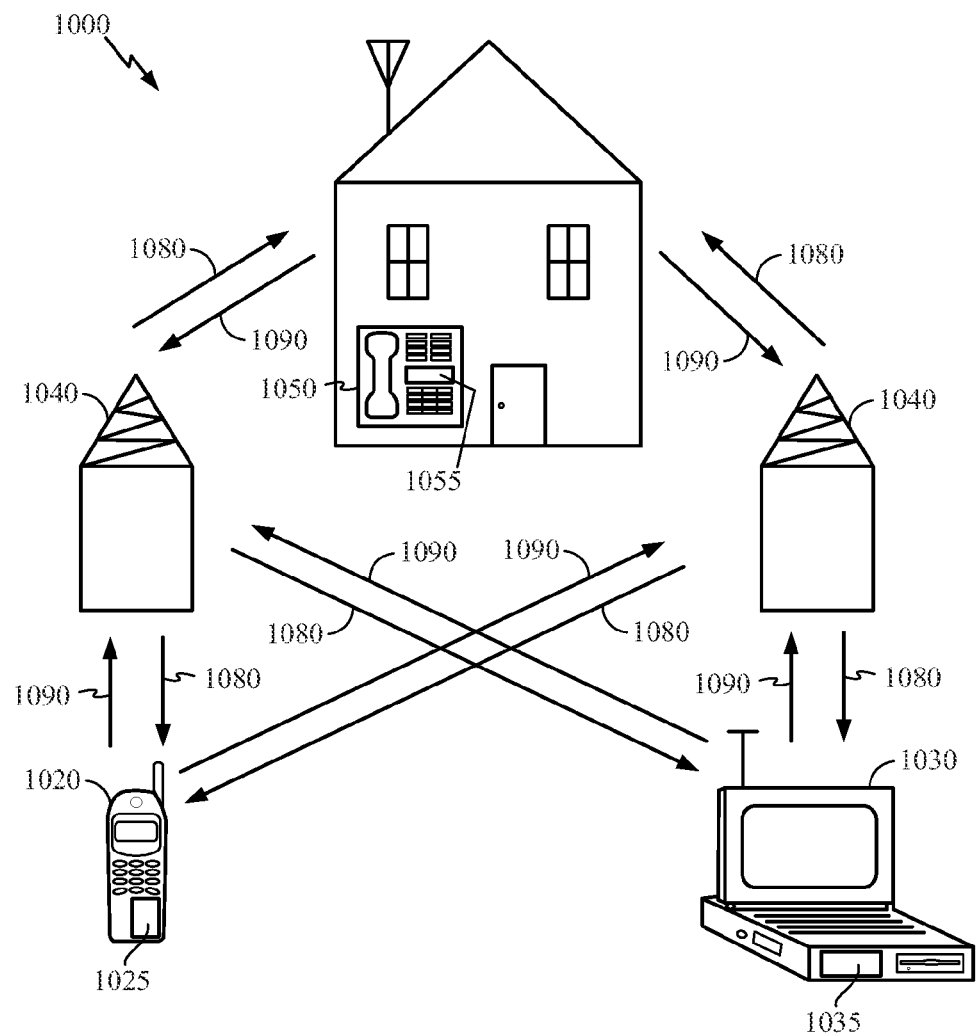
FIG. 10

SYSTEM AND METHOD FOR SHARED SENSING MRAM

CLAIM OF PRIORITY UNDER 35 U.S.C. §119

The present application for patent claims priority to Provisional Application No. 61/380,832, entitled "MRAM Read Reference Generation Scheme Using Normal Read Path," filed Sep. 8, 2010, and assigned to the assignee hereof and hereby expressly incorporated by reference herein.

FIELD OF DISCLOSURE

The present application relates to non-volatile resistive memories and, more particularly, to generation and distribution of reference voltages for accessing non-volatile resistance memories.

BACKGROUND

Personal computing devices such as portable wireless telephones and personal digital assistants (PDAs) are requiring ever-increasing data storage capacity to perform a continuously wider scope of applications. For example, a wireless telephone can include a digital video camera, video and audio file player, portable game player, and Internet access/web browser. Concurrent with the requirement for handling a wider scope of applications, battery life is highly valued and, therefore, power consumption by the data storage is preferably kept to a minimum.

Resistance-memories, which store data as a switchable resistance, show promise for meeting anticipated storage needs in applications such as personal computing devices. One type of resistance memory, spin transfer torque (STT) magnetic tunneling junction (MTJ), or STT-MTJ shows particular promise. STT-MTJ has high read/write access speed, is compatible with MOS processing, and has very high cycle endurance. In brief, an STT-MTJ cell includes a fixed magnetic layer and a free magnetic layer, each having magnetic domains. The alignment of the free magnetic layer domains relative to the fixed magnetic layer domains can be switched into one of two stable states, parallel (P) and anti-parallel (AP). One of the P and AP states may represent a binary "0" and the other a binary "1." The electrical resistance of the STT-MTJ in the P state is lower than its resistance in the AP state. An STT-MTJ cell may therefore be read by detecting its resistance.

The conventional means for reading an STT-MTJ cell is by passing a read current through it and comparing, by a sensing amplifier, the resulting "read" voltage to a reference voltage. For read accuracy, the reference voltage is ideally halfway between the "0" voltage and the "1" voltage. To provide a reference voltage at this desired halfway point a reference current, ideally having the same magnitude as the read current, is passed through a parallel arrangement of a reference STT-MTJ programmed at "0" state and a reference STT-MTJ programmed at a "1" state. Ideally the reference STT-MTJs have P and AP state resistances identical to the P and AP state resistances of the actual storage STT-MTJs. Therefore, assuming the reference current and read current have the same magnitude, this generates a reference voltage at the ideal point, halfway between the "0" voltage and the "1" voltage.

In a conventional magnetic random access memory (MRAM) formed as an m column by n row array of STT-MTJ cells, one sensing amplifier may be provided for each of every L columns (e.g., four, six, eight), and a reference circuit may be provided for feeding a reference voltage line that connects to one of the inputs of the sensing amplifiers.

For read accuracy and access speed, a general design goal is having both the reference voltage and the read voltage reach an acceptably steady state at the inputs of the sensing amplifier as quickly as possible. However, in a conventional magnetic random access memory (MRAM) formed of STT-MTJ cells the path through which the reference current flows has a significantly different structure and arrangement, and different electrical characteristics as compared to the path through which the read current flows. The differences in electrical characteristic may include significant differences in their respective loads. Further, the path for the reference current and the path for the read current may have substantially different structure, and therefore variances in their respective physical parameters due to fabrication tolerances may cause a corresponding large variance in the difference between their electrical characteristics, and hence their different delay. A result may be a corresponding significant variance in read access timing.

A need has therefore existed in the MRAM arts for fast arrival of stable, accurate read voltages and reference voltage at inputs of read sensing amplifiers, as well as other performance and yield-increasing improvements.

SUMMARY

Exemplary embodiments include resistive memory devices and methods that provide, among other features, benefits and advantages, inherently close matching between the loads on read current path and reference current path, substantially irrespective of chip to chip fabrication variance. Resistive memory devices and methods according to the exemplary embodiments further provide, among other features and benefits, generation of reference voltage by STT-MTJ cells identical to and arranged with bit storage STT-MTJ cells. In one aspect, the only difference between reference STT-MTJ cells and data storage STT-MTJ cells may be their designation. Resistive memory devices and methods according to the exemplary embodiments may further provide, among other features and benefits, a resistive memory array not requiring special reference voltage circuits and, instead, using regular resistive memory storage cells for reference voltage.

In one embodiment a magnetic random access memory (MRAM) comprises a resistive memory having a plurality of resistive memory cells, a reference node, and a read mode switch circuit, configured to selectively switch between a first read mode coupling a first two or more of the resistive memory cells to the reference node, and a second read mode coupling a second two or more of the resistive memory cells to the reference node.

In one aspect a reference current source may be coupled to the reference node, and the reference current source may be configured to generate a first reference current through the first two or more of the resistive memory cells to generate a reference voltage at the reference node.

In another aspect, a read mode switch circuit may be configured to form, in the first read mode, first reference current paths, each extending from the reference node through a corresponding one of the first two or more of the resistive memory cells and to form, in the second read mode, second reference current paths, each extending from the reference node through a corresponding one of the second two or more of the resistive memory cells.

In one embodiment an MRAM may include, in one aspect, a plurality of row decoders and a shared charge dual voltage row driver for the plurality of row-decoders. In a further aspect a shared charge dual voltage row driver may include a first switched driver transistor switchably coupling a common word line feeding the plurality of row decoders to a first voltage rail, and a second switched driver transistor switchably coupling the common word line to a second voltage rail.

According to one embodiment, a method for magnetic random access memory (MRAM) storage is provided, and methods may include programming a resistive memory cell of a first MRAM bank as a first bank binary 0 reference cell and a resistive memory cell of the first MRAM memory bank as a first bank binary 1 reference cell, programming a resistive memory cell of a second MRAM bank as a second bank binary 0 reference cell and a resistive memory cell of the second MRAM memory bank as a second bank binary 1 reference cell, generating a reference voltage based on the first bank binary 0 reference and the first bank binary 1 reference, and reading a resistance memory cell of the second MRAM bank based on the reference voltage.

In one aspect, one example method for MRAM storage may include generating a reference voltage based on the second bank binary 0 reference cell and the second bank binary 1 reference cell, and may include reading a resistance memory cell of the first MRAM bank based on the reference voltage. In one further aspect, reading the resistance memory cell of the second MRAM bank may include generating a read current flow through the resistance memory cell of the second MRAM bank concurrent with generating a reference current flow through the first bank binary 0 reference cell and the first bank binary 1 reference cell.

In one aspect, one example method for MRAM storage may include changing a read mode by, in one example, generating a reference voltage based on the second bank binary 0 reference cell and the second bank binary 1 reference cell by, in one further aspect, uncoupling the first bank binary 0 reference cell and the first bank binary 1 reference cell from the reference node, and coupling the second bank binary 0 reference cell and the second bank binary 1 reference cell concurrently to the reference node.

According to one embodiment, a magnetic random access memory (MRAM) storage may include means for programming a resistive memory cell of a first MRAM bank as a first bank binary 0 reference cell and a resistive memory cell of the first MRAM memory bank as a first bank binary 1 reference cell, means for programming a resistive memory cell of a second MRAM bank as a second bank binary 0 reference cell and a resistive memory cell of the second MRAM memory bank as a second bank binary 1 reference cell, means for generating a reference voltage based on the first bank binary 0 reference and the first bank binary 1 reference, and means reading a resistance memory cell of the second MRAM bank based on the reference voltage.

In one aspect, on example MRAM storage may include means for programming a binary 0 reference cell and the second bank binary 1 reference cell, and means for reading a resistance memory cell of the first MRAM bank based on the reference voltage.

According to one embodiment a computer product having a computer readable medium may comprise instructions that, when read and executed by a processor, cause the processor to program a resistive memory cell of a first magnetic random access memory (MRAM) bank as a first bank binary 0 reference cell and a resistive memory cell of the first MRAM memory bank as a first bank binary 1 reference cell, program a resistive memory cell of a second MRAM bank as a second bank binary 0 reference cell and a resistive memory cell of the second MRAM memory bank as a second bank binary 1 reference cell, control a generation of a reference voltage based on the first bank binary 0 reference cell and the first bank binary 1 reference cell, and control a read of a resistance memory cell of the second MRAM bank based on the reference voltage.

BRIEF DESCRIPTION OF THE DRAWINGS

The accompanying drawings are presented to aid in the description of embodiments of the invention and are provided solely for illustration of the embodiments and not limitation thereof.

FIG. 1 is a simplified schematic diagram of one MRAM cell row, associated reference circuit and sense amplifier.

FIG. 2 is a simplified schematic diagram of one shared sensing MRAM device according to one exemplary embodiment, illustrating read and reference current paths in one example bank read mode.

FIG. 3 is a simplified schematic diagram of one shared sensing MRAM device according to one exemplary embodiment, illustrating read and reference current paths another example bank read sharing mode.

FIG. 4 a simplified schematic diagram of one example reference row designation in a shared sensing MRAM device according to one exemplary embodiment.

FIG. 5 shows a schematic diagram of one example dual voltage row decoder.

FIG. 6 is a simplified schematic diagram of one shared charge dual voltage row decoder, in one arrangement according to an aspect of one exemplary embodiment.

FIG. 7 shows one timing diagram of one example word line voltage with respect to one read control signal sequence applied, according to one aspect, to one shared charge dual voltage row decoder according to one exemplary embodiment.

FIG. 8 is a functional block diagram of one example computing device according to one or more exemplary embodiments.

FIG. 9 is a functional flow diagram of one process in fabricating a shared sense amplifier MRAM device according to one or more exemplary embodiments.

FIG. 10 illustrates an exemplary wireless communication system in which one or more embodiments of the disclosure may be advantageously employed.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/ or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequences of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

FIG. 1 is a simplified diagram of a conventional MRAM STT-MTJ cell row 102, an associated conventional reference circuitry 104 having a conventional reference STT-MTJ device 106 with two STT-MTJ reference cells, R0 and R1. FIG. 1 also shows a read current RCL and a reference current RFC such as generally used during a read of an STT-MTJ cell such as the STT-MTJ cell 108. Conventions vclamp transistors (shown but not separately numbered) may be included. As per conventional MRAM read means, the read current RCL flow is from the power rail vdd_io through the read current PMOS transistor P1, and through the STT-MTJ cell 108, to establish a voltage at the input 110A of the sense amplifier 110. The voltage is indicative of the magnetization state of the STT-MTJ element 1082 of the STT-MTJ cell 108. Transistors other than P1 are also in the RCL path, and will be discussed in greater detail below. Further according to conventional MRAM read means, a reference current RFC is flow from the power rail vdd_io, through the reference current PMOS transistors P2 and P3, and through the parallel arrangement of the R0 and R1 reference cells of the STT-MTJ conventional reference cell 106.

As per conventional MRAM reading means, one of the reference STT-MTJs R0 and R1 is programmed to "0" state (i.e., one of the P or AP states) and the other of the reference STT-MTJs R0 and R1 is programmed to the "1" state (i.e., the other of the P or AP states). The voltage at the reference voltage line 112, which couples to the other input 110B of the sense amplifier 110, will therefore have a steady-state value approximately halfway between that representing a "0" and that representing a "1."

Initiation of the depicted RCL flow includes enabling the read select NMOS transistors N1 and N2 of the STT-MTJ cell 108, and the word enabled NMOS transistor N3 of the STT-MTJ cell 108. After a certain time delay the voltage at the bit line reference 114, which is coupled to input 110A of the sense amplifier, is sufficiently steady-state for the sense amplifier 110 to read the STT-MTJ cell 108, if the reference voltage on the reference voltage line 112 is also sufficiently steady-state. Referring to the initiation of the reference current RFC, according to conventional MRAM array design this is done by enabling the "dWL" word enabled NMOS transistors N4 and the ref_rdsel read enabled NMOS transistors N5 and N6. After a time delay, the voltage at the reference voltage line 112 is at a steady state sufficient to provide a reference for the sense amplifier 110.

If the current sources for RCL and RFC have substantially the same capability, and the loads on the RCL and RFC paths are substantially the same, then the respective time delay for the voltages at inputs 110A and 110B of the sense amplifier 110 to attain a sufficient steady state for sampling will be approximately the same. The architecture of a conventional MRAM array, however, has inherent differences in the path through which RLC flows and the path through which RFC passes. These differences include significant differences in structure, including length, and in their respective load. Examples of such differences will be described. Before such description, certain assumptions for simplifying and focusing the description will be identified. One is that series resistance loads along RCL and RFC may be omitted from consideration, as these may have low contribution to the load differences. The junction load of the word line enabled NMOS transistor N3 of the selected STT-MTJ cell 108 bit, and corresponding junction load of the dWL enabled NMOS transistor N4 of the STT-MTJ reference cell 106 may be omitted.

Turning now to the load on the depicted conventional read current path RCP, this load includes the eight NMOS junction loads presented by the eight upper read select NMOS transistors N1, eight more NMOS junction loads presented by the eight lower read select NMOS transistors N2, and what may be assumed as an NMOS gate load presented by input 110A of the sense amplifier. In other words, the load on the read current path RCP is the junction load of one typical read select NMOS multiplied by twice the bit line count (8 in the FIG. 1 example), added to one NMOS gate load, or 16 NMOS junction plus 1 NMOS gate. Referring now to RFC, its load consists of the NMOS junction loads presented by the two upper ref_rdsel NMOS transistors N5, the gates of the PMOS transistors P1, P2 and P3, and the NMOS gate at the input 110B of the sense amplifier, or SA, 110.

Therefore, in the FIG. 1 depiction of a conventionally read row of an STT-MTJ array, the load on the RCL path includes RCL_LD, totaling 16 read select transistor junctions and 1 NMOS gate, while the load on the RFC path includes a smaller RCL_LD, totaling 2 read select NMOS transistor junctions, 3 PMOS transistor gates and 1 NMOS gate input presented by the sense amplifier. This constitutes a significant imbalance in the respective loads, which may cause significant differences in the settling time between the bit line reference voltage and the reference voltage. As will also be appreciated by persons of ordinary skill in the art upon viewing FIG. 1, the conventional MRAM array requires reference STT-MTJ cells R0 and R1, arranged and requiring supporting circuitry separate from and different than regular storage STT-MTJ cells within the row 102.

One embodiment of the invention includes, among other features, a shared sensing MRAM providing a near match, in particular a substantially equal capacitance, between the load on the read current path and the load on the reference current path during read operations and, further, providing a reference voltage for reading the STT-MTJ cells without requiring a special reference circuit.

One example shared sensing MRAM according to one exemplary embodiment may comprise a first bank of resistive memory cells and a second bank of resistive memory cells. In one aspect the first bank of resistive memory cells and the second bank of resistive memory cells may each include multiple n×m arrays of STT-MTJ cells. For brevity, hereinafter the phrase "n×m arrays of STT-MTJ cells" may be abbreviated as "I/O." It will therefore be understood that the first bank of resistive memory cells may comprise a first plurality of I/Os and the second bank of resistive memory cells may comprise a second plurality of I/Os. For convenience in describing examples, the first bank and the second bank may be referred to as "Bank0" and "Bank1," respectively. It will be understood that "first bank," "second bank," "Bank0" and "Bank1" are simply names, and confer no limitation on structure or arrangement, and are not intended to reference any structure, function, or other subject matter outside of this disclosure having like name. It will also be understood that "m" and "n" are generic references to columns and rows, respectively, and may be any value.

In one aspect, one row of the n rows of STT-MTJ cells of each of at least two I/Os of MRAM Bank0 and one row of STT-MTJ cells of each of at least two I/Os of MRAM Bank1 may be designated as a reference row. Further to the one aspect, the "reference row" may be a logical designation that does not require the designated reference row have any structural feature different from any other of n rows. Also, as will be appreciated by persons of ordinary skill in the art from this disclosure, the designation of which row of the I/Os forming the MRAM Bank0 and MRAM Bank1 is not necessarily fixed.

In one aspect, for both MRAM Bank0 and MRAM Bank1, all of the STT-MTJ cells of the designated reference row of one of its I/Os may be programmed to a logical "0" state (e.g., a P state), and all of the STT-MTJ cells in the designated reference row of another of its I/Os may be programmed to a logical "1" state (e.g., a AP state). Further to this one aspect, to read STT-MTJ cells from the MRAM Bank0, described circuitry may generate a reference voltage using a logical "1" STT-MTJ cell in the MRAM Bank1 I/O reference row programmed at logical "1," and a logical "0" STT-MTJ cells in the MRAM Bank1 I/O reference row programmed at logical "0." As one particular example, any one of the STT-MTJ cells in the MRAM Bank1 I/O reference row programmed at logical "1" may be enabled while, at the same time, enabling any one of the STT-MTJ cells in the MRAM Bank1 I/O reference row programmed at logical "0." The concurrently enabled reference STT-MTJ cells are then coupled to a reference input of a sense amplifier to ground, thereby forming parallel paths from the reference input to ground. In other words, according to this aspect there is provided a means for coupling a first bank binary 0 reference cell and a first bank binary 1 reference cell concurrently to the reference input of a sense amplifier. It will be appreciated from this disclosure that the "reference STT-MTJ cells" may be structurally identical to the storage STT-MTJ cells, may be in the same array as the storage STT-MTJ cells, and may be addressed and enabled using substantially the same addressing and enabling circuitry used to address and enable the storage STT-MTJ cells. Further to this example, a reference current having substantially the same magnitude as the read current used to read an STT-MTJ cell in the MRAM Bank0 may be injected into the parallel paths, therefore creating through two regular structure STT-MTJ cells in the MRAM Bank1 the target (midpoint) reference voltage for reading an STT-MTJ cell in Bank1.

In another example according to the above-described aspect, to read STT-MTJ cells from the MRAM Bank1, described circuitry may generate a reference voltage using an STT-MTJ cell in an MRAM Bank0 I/O reference row programmed at logical "1," and an STT-MTJ cell in an MRAM Bank1 I/O reference row programmed at logical "0." Substantially the same as the above-described use of STT-MTJ cells in the MRAM Bank1 reference rows for reading STT-MTJ cells from the MRAM Bank0. any one of the STT-MTJ cells in the MRAM Bank0 I/O reference row programmed at logical "1" may be enabled while, at the same time, enabling any one of the STT-MTJ cells in the MRAM Bank0 I/O reference row programmed at logical "0" and, concurrently, coupling these two enabled reference STT-MTJ cells as parallel paths from a reference input of a sense amplifier to ground. Then, injecting into these parallel paths through the MRAM Bank0 reference cells a reference current of substantially the same magnitude as the read current used to read an STT-MTJ cell in the MRAM Bank1 creates, again using two regular structure STT-MTJ cell in the MRAM Bank1, the target (midpoint) reference voltage for reading an STT-MTJ cell in the MRAM Bank0.

In another aspect, for each of the MRAM Bank0 and MRAM Bank1, assuming each has a "reference row" spanning two I/Os, the "reference row" may have only two STT-MTJ cells, one programmed at a logical "0" and the other programmed at a logical "1." In one example according to this aspect, only two fixed reference cells need to be assigned in each MRAM Bank, one being a "0" and the other being a "1." In another aspect, two, four or more STT-MTJ cells in each reference row may be programmed at logical "0" and logical "1" values. Further to this aspect, additional selection logic may be included to select among different combinations of reference STT-MTJ cells which, as may be understood by persons of ordinary skill in the art from this disclosure, may provide an adjustable read reference voltage.

In one example shared sensing MRAM memory according to one exemplary embodiment a shared sense amplifier circuit is provided, and may include a sharing mode switch, a first sense amplifier and a second sense amplifier forming a pair of shared sense amplifiers, and a reference node. In one aspect, the reference node may be coupled to the reference voltage input of both the first and the second sense amplifiers. In another aspect a reference current source may couple to the reference node.

In one example shared sensing MRAM according to one exemplary embodiment, shared sense amplifier circuits may be configured to be switchable between what may be termed a "Bank0 read mode" and a "Bank1 read mode." It will be understood that "Bank0 read mode" and "Bank1 read mode" are only names used for convenience in referencing illustrations of concepts, and have no inherent meaning as to structure. Among other features, and as will be described in greater detail at later sections, in the Bank0 read mode the sense amplifier circuit may provide concurrent reading of one STT-MTJ cell in one row of each of two I/Os of the MRAM Bank0, using two of the STT-MTJ cells in the reference rows of the MRAM Bank1 for a reference voltage. Further among other features, in the Bank1 read mode a shared sense amplifier circuit may provide for concurrent reading one STT-MTJ cell in one row of each of two I/Os of the MRAM Bank1, using two of the STT-MTJ cells in the reference rows of the MRAM Bank0 for a reference voltage.

In one aspect of one example shared sensing MRAM according to one exemplary embodiment, the shared sense amplifier circuit, or other circuitry, may be configured to enable designated STT-MTJ reference cells within two I/Os of MRAM Bank1 during the Bank 0 read mode and designated STT-MTJ reference cells within STT-MTJ cells of two I/Os of MRAM Bank 0 during the Bank 1 read mode. In both the Bank0 read mode and the Bank1 read mode, one of the enabled STT-MTJ reference cells will be in one of the "0" or "1" states, and the other will be in the other of these two states. In one aspect, since the designated STT-MTJ reference cells are among the general STT-MTJ cells, provision for enabling these may be, for example, a particular control or logic added to the same row and column decoder used to access the non-designated STT-MTJ cells.

In one aspect one example shared sensing MRAM according to one exemplary embodiment, a read mode switch may be configured to establish, concurrent with the Bank0 reading mode enabling of one designated reference STT-MTJ cell in each of two I/Os of Bank1, a coupling from these enabled designated reference STT-MTJ cells to the reference node of the shared sense amplifier. As previously described, one of these enabled designed reference STT-MTJ cells will be in one of a "0" or "1" state and the other will be in the other of the "0" or "1" states. The reference current source at the reference node will therefore cause a flow of reference current through a parallel arrangement of an STT-MTJ cell in the "0" state and an STT-MTJ cell in the "1" state. A reference voltage is therefore established on the reference node of the shared sense amplifier circuit.

It will be appreciated by persons of ordinary skill in the MRAM arts from this disclosure that in the above-described Bank0 read mode, the current path for the reference current, flowing through the two designated reference STT-MTJ cells may be substantially identical to the path established from the sense amplifiers to the STT-MTJ cells in the MRAM Bank0 that are being read.

In one aspect, one example shared sensing MRAM according to one exemplary embodiment may include a shared sense amplifier circuit configured to provide, during the Bank1 read mode, a concurrent reading of one STT-MTJ cell from each of two I/Os of MRAM Bank1, concurrent with the above-described utilizing of two STT-MTJ cells (one at a "0" state and the other at a "1" state) in the I/Os of MRAM Bank0 to establish a reference voltage at the shared sense amplifiers.

Specific examples embodying various ones of the above-described concepts, in various alternative arrangements, will be described. It will be understood that these are only examples to further assist persons of ordinary skill in the art in understanding the concepts, and are not intended to limit the structure or the arrangements by which MRAM systems and methods according to the exemplary embodiments may be practiced.

FIG. 2 is a simplified schematic of one example shared sensing MRAM memory 200 according to one embodiment, having an MRAM Bank0 202 and an MRAM Bank1 204. Both the MRAM Bank0 202 and the MRAM Bank1 204 may be formed of, for example, two m-bit by n-row STT-MTJ arrays (also referenced herein as I/Os). The value of "m" may be, for example, 16. It will be understood that an m of 16 bits is only an example, and is not intended to limit the scope of any of the exemplary embodiments. In one aspect all n of the STT-MTJ cell rows of each of the MRAM Bank0 202 and MRAM Bank1 204 may function as read/write storage, and each of the banks may have one or more additional rows of STT-MTJ cells designated as "reference rows." Alternatively, each of the MRAM Bank0 202 and MRAM Bank1 204 may have only n rows of STT-MTJ cells, with one of the n rows being designated as a reference row. The actual capacity of each of the MRAM Bank0 202 and MRAM Bank1 204 would therefore be n−1 rows.

As will be described in greater detail in reference to the FIG. 2 example, the STT-MTJ "reference rows" of MRAM Bank0 202 have one or more STT-MTJ cells programmed at a logical "0" value and one or more STT-MTJ cells programmed at a logical "1" value. As will also be described, when STT-MTJ cells within the MRAM Bank1 204 are read, circuitry shown in FIG. 2 will enable at least one of the MRAM Bank0 202 logical "0" STT-MTJ cells and at least one of the MRAM Bank0 204 logical "1" reference cells.

Additional circuitry shown in FIG. 2, and described in greater detail below, will couple the enabled MRAM Bank0 202 logical "0" and logical "1" reference STT-MTJ cells in parallel and inject a reference current through these parallel enabled STT-MTJ cells to create a reference voltage to perform the reading of the MRAM Bank1 204. Referring to FIG. 2, the example shared sensing MRAM memory 200 may further include a shared sense amplifier circuit 206 having a first sense amplifier (SA) 2066 and a second sense amplifier (SA) 2068, together with read current source PMOS transistors P20, P22, read enable PMOS transistors P24, P26, and reference current source PMOS transistors P28, P30.

As will be understood from this disclosure by persons of ordinary skill in the art of resistive memory, P24 and P26 may further provide for the node "A" of each SA 2066, 2068 to reach the same level as the steady state of a reference level in the beginning of a sensing. For example, when rdsel is activated P24 and P26 may be still turned on, and this may provide equal paths for both RCL and RFC. Then, in one example operation at one contemplated example rate of operation, at for example approximately to 1 to 2 nanoseconds after rdsel is on, P24 and P26 may switch off and node "A" may then start to sense. Persons of ordinary skill in the art will understand that these are only example timings, showing concepts relating to P24 and P26 in relation to specific example operations. Further, such persons will understand that using other rates of operation, or other circuit arrangements practicing according to the exemplary embodiments, that other switch on and switch off timings of P24 and P26, or equivalents, may reflect or demonstrate these same concepts.

Referring still to FIG. 2, vclamp NMOS transistors (shown but not numbered) may be included, performing substantially the same voltage limiting function as vclamp transistors in conventional MRAM circuits. A reference node 2070, together with the gates of reference current transistors P28 and P30 being connected, equalizes the voltage at points VA and VB, as described in greater detail below.

To avoid unnecessary complexity in the figures and better focus on features showing concepts unique to the embodiments, FIG. 2 omits explicit depiction of write circuitry for setting the magnetization states of the depicted resistive memory cells. It will be understood that such write circuitry may be according to conventional means, which may be readily selected and adapted to practices according to the exemplary embodiments by persons of ordinary skill in the MRAM arts, in view of the present disclosure.

As will be described in greater detail at later sections, in the example shared sensing MRAM memory 200 the read mode switch sections 2062A, 2062B, 2064A, 2064B may be controlled to perform as a read mode switch circuit by respectively switching, under control of the read mode control 2084, the connections between the shared sense amplifier circuit 206 and particular STT-MTJ cells and rows within the MRAM Bank0 202 and MRAM Bank1 204 to operate in a "Bank0 read mode," which is depicted in FIG. 2, and a "Bank1 read mode," which is described in reference to FIG. 3.

In overview, in the FIG. 2 depicted Bank0 read mode STT-MTJ row 204A and STT-MTJ row 204B represent designated reference STT-MTJ rows of MRAM Bank1 204 that are enabled for reading one STT-MTJ cell from the MRAM Bank0 202 first I/O STT-MTJ row 202A and one STT-MTJ cell from MRAM Bank 202 second I/O STT-MTJ row 202B. In the specific FIG. 2 example, only reference STT-MTJ cell within the STT-MTJ row 204A that is enabled is its BL7 STT-MTJ cell and, likewise, the only reference STT-MTJ cell within the STT-MTJ row 204B that is enabled is its BL7 STT-MTJ cell. A word enable line B0_WL couples to a word enabled NMOS transistor (shown but not numbered) in each STT-MTJ cell of STT-MTJ rows 202A and 202B and, likewise, a word enable line B1_WL couples to a word enabled NMOS transistor (shown but not numbered) in each STT-MTJ cell of STT-MTJ rows 204A and 204B. It will be assumed in the described example operations, unless otherwise stated, that the word enable lines B0_WL and B1_WL are enabled.

Referring still to FIG. 2, in one aspect, one of these two BL7 STT-MTJ reference cells (e.g., the BL7 STT-MTJ reference cell of the STT-MTJ row 204A) was previously programmed at a logical "0", and the other (e.g., the BL7 STT-MTJ reference cell of the STT-MTJ row 204B) was previously programmed at a logical "1." Together with the depicted ON and OFF states of switches 2080 and 2082 within the switch sections 2064A and 2064B, respectively, the result is the pair of parallel reference current paths RFC1 and RFC2. In the depicted example, the power supply vdd_sa and reference current transistor P28 function as a reference current source for the reference current path RFC1 that, after passing through P28 passes through the adjacent vclamp transistor, then through switch 2080 of switch section 2064A and then through BL7 of the STT-MTJ row 204A. Likewise the power supply vdd_sa and reference current transistor P30 function as a reference current source for the reference current path RFC2 that, after passing through P30 passes through the adjacent vclamp transistor then through switch 2080 of switch section 2064B and then through BL7 of the STT-MTJ row 204B.

As described above, in the FIG. 2 example it will be assumed that the BL7 STT-MTJ reference cell of the STT-MTJ row 204A was previously programmed at a logical "0", and the BL7 STT-MTJ reference cell of the STT-MTJ row 204B was previously programmed at a logical "1." Therefore, assuming that P28 and P30 have been properly structured, in a manner as can be readily determined by persons of ordinary skill in the art from this disclosure, the current through the reference current paths RFC1 and RFC2 establishes a target midpoint reference at the reference input "B" of the first sense amplifier 2066 and the reference input "B" of the second sense amplifier 2068. The result is that two otherwise regular STT-MTJ cells, namely the designated BL7 STT-MTJ reference cell of the designated STT-MTJ row 204A and the designated BL7 STT-MTJ reference cell of the designated STT-MTJ row 204B, provide a reference voltage for reading STT-MTJ cells from Bank0.

Referring still to FIG. 2, in the depicted Bank0 read mode the read mode switch section 2062A couples read input "A" of the first sense amplifier 2066 to an enabled STT-MTJ cell in the STT-MTJ row 202A, and the read mode switch section 2062B couples read input "A" of the second sense amplifier 2068 to an enabled STT-MTJ cell in the STT-MTJ row 202B. The state of these Bank0 STT-MTJ cells can therefore be read.

Referring still to FIG. 2, it will be understood that the Bank Read Mode Controller 2084 controlling read mode switches 2062A, 2062B, 2064A, 2064B, each comprising transistors 2080, 2082, is only one example implementation from establishing the depicted reference current paths RFC1 and RFC2, and is not intended as any limitation on the scope of any embodiment or any aspect of any embodiment. With respect to structure of the Bank Read Mode Controller 2084, this may be a state machine configured to generate, for example, the bsel0 and bsel1 control signals used to cause the example transistor switches 2080 and 2082 to switch as described above. Persons of ordinary skill in the art, by combining general engineering know-how possessed by such persons with the present disclosure, can readily configure a state machine to generate the bsel0 and bsel1 signals (or equivalent signals for a different switch topology) to implement the Bank Read Mode Controller 2084.

As will be appreciated by persons of ordinary skill in the art from this disclosure, the FIG. 2 example shared sensing MRAM 200 provides the reference voltage at the reference input "B" of each of the first and second SAs 2066 and 2068 without a special reference circuit such as the conventional reference circuit 104 depicted at FIG. 1. It will also be appreciated that the designated reference STT-MTJ cells (e.g., STT-MTJ cell BL7 of the STT-MTJ row 204A and STT-MTJ cell BL7 of the STT-MTJ row 204B) may be identical to the regular bit storage STT-MTJ cells. It will be further appreciated that these designated reference STT-MTJ cells may be accessed using the same access circuitry used for the regular bit storage STT-MTJ cells.

Referring still to FIG. 2, it will be understood that the BL7 STT-MTJ cell in the STT-MTJ row 204A designated as one of the Bank1 reference STT-MTJ cells is not necessarily in the same position as the BL7 STT-MTJ cell in the STT-MTJ row 204B designed as the other of the Bank1 reference cells. For example, even if STT-MTJ cell BL7 of the STT-MTJ row 204A is designated as one Bank1 reference STT-MTJ cell, an STT-MTJ cell of the STT-MTJ row 204B other than its BL7 may be selected as the other Bank1 reference STT-MTJ cell. In another aspect, all of the STT-MTJ cells of the Bank1 STT-MTJ reference row 204A may have been preprogrammed to one of a 0 state or 1 state and all of the STT-MTJ cells of the Bank1 STT-MTJ reference row 204B may have been preprogrammed to the other of the 0 state and 1 state. In another aspect, any one STT-MTJ cell from the depicted row 204A and any one STT-MTJ cell from the depicted row 204B may be selected as the Bank1 reference STT-MTJ cells.

The load on the reference current paths RFC1 and RFC2 will now be compared to the load on the read current path RDC1. Referring first to the reference current path RFC1, its load includes the PMOS gates P28 and P30, the NMOS gate at the reference input "B" of the first SA 2066, the 16 NMOS junctions at the top (meaning closest to the bit reference line 220) read select NMOS transistors N20 of the Bank1 STT-MTJ reference row 204A and the 16 NMOS junctions at the bottom read select NMOS transistors N22 of the Bank1 STT-MTJ reference row 204A. The total load on the reference current path RFC1 is therefore 2 PMOS gates, 1 NMOS gate, and 32 NMOS junctions. It can be seen from inspection of FIG. 2 that the load on the reference current path RFC2 is the same as the above-described load on the reference current path RFC1. Referring now to the load on the read current path RDC1, from inspection this can be seen as the 16 NMOS junctions at the top read select NMOS transistors N20 of the Bank0 STT-MTJ row 202A and the 16 NMOS junctions at the bottom read select NMOS transistors N22 of the Bank0 STT-MTJ row 202A. The load on the read current path RDC1 is therefore substantially the same as the load on the reference current path RFC1.

Therefore, as will be readily appreciated by persons of ordinary skill in the art, an MRAM such as the FIG. 2 example shared sensing MRAM 200 according to the exemplary embodiments provides a balanced load between the read path (e.g. read paths RDC1 and RDC2) and the reference paths (e.g., RFC1 and RFC2). It is therefore seen that, among other benefits, an MRAM according to the present embodiment may provide improved reading speed. Further, it will be appreciated by persons of ordinary skill in the art that shared sensing MRAM according to the present embodiments may provide, among other benefits, improved yield due to an inherently tighter variance between the reference voltage time delay and the read voltage time delay.

FIG. 3 shows the above-described example shared sensing MRAM memory according to one or more exemplary embodiments after being switched into an example Bank1 read mode 300. The general structure depicted by FIG. 3 is identical to the structure depicted at FIG. 2. One significant difference, though, is that instead of STT-MTJ reference rows 204A and 204B of MRAM Bank1 204 being enabled to generate a reference voltage for reading STT-MTJ cells within rows 202A and 202B of MRAM Bank0, reference rows 302A and 302B within MRAM Bank0 202 are enabled. These may then be used, as described above, for generating a reference voltage to read STT-MTJ cells within STT-MTJ rows 304A and 304B of MRAM Bank1 204. Related to this mode difference, the ON/OFF states of switch transistors 2080 and 2082 form read current paths RDC3 and RDC4 (instead of the FIG. 2 read current paths RDC1 and RDC2) and form the FIG. 3 reference current paths RFC3 and RFC4 (instead of the FIG. 2 reference current paths RFC1 and RFC2). In addition, through read input "A" of the first sense amplifier 2066 (compared to the RFC3 voltage at the reference input "B") the example enabled STT-MTJ cell BL7 of the STT-MTJ row 304A may be read. Further, through read input "A" of the second sense amplifier 2068 (compared to the RFC4 voltage at the reference input "B") the example enabled STT-MTJ cell BL7 of the STT-MTJ row 304B. Therefore, as can be seen from FIG. 3, in the example Bank1 read mode 300 the sense amplifiers 2066 and 2068 provide reading of the STT-MTJ cell BL7 of the STT-MTJ row 304A and the STT-MTJ cell BL7 of the STT-MTJ row 304B.

FIG. 4 shows a simplified schematic diagram of one example reference row designation in an example shared sensing MRAM 400 according to one exemplary embodiment. Referring to FIG. 4, the shared sensing MRAM 400 may include a first bank of STT-MTJ cells comprising a first bank first I/O 402A and first bank second I/O 402B, and a second bank of STT-MTJ cells comprising a second bank first I/O 404A and a second bank second I/O 404B. Each of the I/Os 402A, 402B, 404A and 404B is shown as a 16-bit by n row array (plus one or more rows of reference STT-MTJ cells). The FIG. 4 example shared sensing MRAM memory 400 may include a shared sense amplifier circuit 406 that may, for example, be implemented by the shared sense amplifier circuit 206 of the FIG. 2 example shared sensing MRAM 200 according to one exemplary embodiment.

With continuing reference to FIG. 4, a first bank read mode word line RWL_B0 extends along one of the n rows of 16 STT-MTJ cells in the second bank first I/O 404A and one of the n rows of 16 STT-MTJ cells in the second bank second I/O 404B. As can be seen, all of the STT-MTJ cells along the first bank read mode word line RWL_B0 are designated as second bank reference STT-MTJ cells, with those in the second bank first I/O 404A preprogrammed at a "0" state (e.g., a P state), which is labeled 442, and all in the second bank second I/O 404B are preprogrammed at a "1" state (e.g., a AP state), which is labeled 440. All other STT-MTJ cells of the second bank first I/O 404A and the second bank second I/O 404B are designated regular STT-MTJ cell, and labeled 444.

In like manner, all of the first bank reference STT-MTJ cells along the RWL_B1 line through the first bank first I/O 402A are preprogrammed at a "0" state, labeled as previously described as 442, and all of the first bank reference STT-MTJ cells along the RWL_B1 line through the first bank second I/O 402B are preprogrammed at a "1" state, labeled as previously described as 440. All other STT-MTJ cells of the first bank first I/O 402A and second bank second I/O 402B are designated regular STT-MTJ cell, labeled 444.

Referring still to FIG. 4, it will be understood that the depiction of all of the designated STT-MTJ reference cells being in the same row is only an example, and that all of the designated STT-MTJ reference cells are not necessarily on the same row. As will be appreciated by persons of ordinary skill in the art, configuring the controller (not shown) in FIG. 4 to always select one STT-MTJ cell preprogrammed at a "0" state and one preprogrammed at a "1" state for establishing a reference voltage at the halfway point may be more difficult if the reference STT-MTJ cells may be at different rows.

In one example operation of the FIG. 4 example shared sensing MRAM 400 may be configured to have, in one aspect, a first bank read mode in which the RWL_B0 line is enabled and the RWL_B1 line is not enabled. Further to the first bank read mode, in one aspect the FIG. 4 example shared sensing MRAM 400 may be configured to enable one STT-MTJ cell 442 in the second bank first I/O 404A and one STT-MTJ cell 440 in the second bank second I/O 404B, such that these form parallel paths from an internal reference node, for example the reference node 2070 of the FIG. 2 example shared sensing MRAM 200. Concurrently, one of the STT-MTJ cells 444 within the first bank first I/O 402A and one of the STT-MTJ cells 444 within the first bank second I/O 402B may be enabled. Further, the two enabled STT-MTJ cells 444 may be read by, for example, sense amplifiers such as the first and second sense amplifiers 2066 and 2068 as described in reference to FIG. 2.

In one aspect the FIG. 4 example shared sensing MRAM 400 may be further configured to have a second bank read mode in which the RWL_B1 line is enabled and the RWL_B0 line is not enabled. Further to the second bank read mode, the FIG. 4 example shared sensing MRAM 400 may be configured to enable one STT-MTJ cell 442 in the first bank first I/O 402A and one STT-MTJ cell 440 in the first bank second I/O 402B, such that these form parallel paths from an internal reference node, for example the reference node 2070 of the FIG. 2 example MRAM 200. Concurrently, one of the STT-MTJ cells 444 within the second bank first I/O 404A and one of the STT-MTJ cells 444 within the second bank second I/O 404B may be enabled. These two enabled STT-MTJ cells 444 may be read by, for example, sense amplifiers such as the sense amplifiers 2066 and 2068 as described in reference to FIG. 2.

FIG. 5 shows a schematic diagram of one example dual voltage row decoder 500 having a PMOS drive transistor 502 coupled to a word line power rail $V_{WL}$ in parallel with a PMOS drive transistor 504 coupled to a $V_{CORE}$ power rail. Combination logic 505 may control the PMOS drive transistors 502 and 504, and another combination logic 506 may control an NMOS word line transistor 507 for driving a word line 510 coupled to an STT-MTJ cell 508. The STT-MTJ cell 508 may be according to the simplified schematic shown in the enlarged region 5080. The FIG. 5 example dual voltage row decoder 500 may employ two power supplies: $V_{IO}$ and $V_{CORE}$. One example $V_{IO}$ may be 1.8V and one example $V_{CORE}$ may be $V_{IO}$ 1.1V $V_{CORE}$. A $V_{WL}$ of 1.5V may be generated by an internal regulator (not shown) using $V_{IO}$. In one example a write operation may be performed at 1.5V ($V_{WL}$) while a read operation may be performed at near 1.1V ($V_{CORE}$). The lower read voltage may provide reduced disturbance reading and may increase reading reliability over a projected lifetime of the STT-MTJ cells. However, a dual voltage row decoder such as the FIG. 5 example 500 may require increased chip size and may reduce the read speed due to the lower $V_{CORE}$.

FIG. 6 is a simplified schematic diagram of one shared charge dual voltage row decoder 600, in one arrangement according to an aspect of one exemplary embodiment. The FIG. 6 shared charge dual voltage row decoder 600 provides a common dual voltage driver 602 for all n row-decoders, represented collectively by the box 606, of an m bit by n row STT-MTJ array. In one aspect the source node of the PMOS driver 6020 couples to the output 6022 of the common dual voltage driver ($V_{COM}$), in contrast to the PMOS drive transistor 502 of the FIG. 5 dual voltage row decoder 500 coupling to only one word line 510. $V_{COM}$ has n outputs, labeled collectively as 604, each feeding a word line decoder that may be identical in topology to the depicted combination logic 6064 controlling word line drivers 6060 and 6062 that drive a word line 608. STT-MTJ cells such as the depicted example 508 may couple to the word line 608. Referring still to FIG. 6, the remaining n−1 word lines are collectively labeled as 6082 and STT-MTJ cells (not shown) such as the depicted example 508 may couple to each of the word lines 6082

Among other features, a shared charge dual voltage row decoder such as the example 600 may minimize chip size increase that may otherwise be required for dual voltage row decoders. Further, in one aspect controlling the PMOS driver 6020 coupled to the $V_{WL}$ (which may, for example at 1.5V) with a RD signal and controlling the PMOS driver 6022 coupled to the $V_{CORE}$ (which may, for example be at 1.1V) with a bRD_d signal, using as described later in reference to FIG. 7 may improve reading performance.

FIG. 7 shows one timing diagram of one example word line voltage with respect to one read control signal sequence applied, according to one aspect, to one shared charge dual voltage row decoder according to one exemplary embodiment. Time lines 702 and 704 show example time versus voltage for the RD and bRD_d signals controlling the PMOS drive transistor 6020 and 6022 of the FIG. 6 shared dual voltage row decoder 602. Time line 706 shows the word line voltage on the word line 608 (or any other of the word lines 6082 for which an associated combination logic 6064 switches 6062 off and 6060 on). Interval 708 represents one example read period and interval 710 represents one example write period.

Referring to FIG. 7, in one aspect, during a read operation with the time interval $T_1$, the $V_{COM}$ node that is precharged to $V_{WL}$, may be floated as the PMOS drive transistors 6020 and 6022 are turned off. Charge sharing may then occur between the parasitic capacitances of the $V_{COM}$ node, depicted as a lumped parameter $C_{VCOM}$, and the associated word line parasitic capacitance of each of the n word lines 6082, depicted as a lumped parameter $C_{WL}$, when the word line drive PMOS transistor 6060 is selected by input addresses to the combination logic 6064. According to one aspect, $V_{GS}$ of the word line drive PMOS transistor 6060 charge sharing operation quickly raises the WL voltage on the word line 608 to the near $V_{CORE}$ level due to higher $V_{GS}$ of drive PMOS transistor 6060. When the bRD_d signal goes low after this charge sharing, the $V_{COM}$ node settles to the $V_{CORE}$ level through the PMOS drive transistor 6022. For write operations, the PMOS drive transistor 6020 may supply $V_{WL}$ (for example 1.5V) to the word lines 6082, as the PMOS drive transistor 6022 is turned off.

FIG. 8 is a functional block diagram of an electronic device 800, such as a wireless phone according to one or more exemplary embodiments. The device 800 may include a shared sensing MRAM circuit 802 coupled to a processor such as a digital signal processor (DSP) 804 that may be coupled to another memory 806, for example a DRAM. In one illustrative example, the shared sensing MRAM circuit 802 may include an apparatus such the shared sensing MRAM described in reference to FIGS. 2-4, or as one alternative, the shared charge dual voltage MRAM 600 described in reference to FIG. 6 or, as another example alternative, any combination thereof.

Referring still to FIG. 8, the electronic device 800 may have a display controller 808 coupled to the DSP 804 and to a display 810. In addition, a coder/decoder (CODEC) 812 may be coupled to the DSP 804, and to a speaker 836 and a microphone 838. A wireless controller 818 may be coupled to the digital signal processor 804 and to a wireless antenna 820. In a particular embodiment, the DSP 804, the display controller 808, the shared sensing MRAM described in reference to FIGS. 2-4, or as one alternative, the shared charge dual voltage MRAM 600 described in reference to FIG. 6, and the CODEC 812, and the wireless controller 818, may be included in a system-in-package or system-on-chip (SOC) 822. In a particular embodiment, an input device 830 (e.g., touchpad, keypad, other human command interface) and a power supply 844 are coupled to the SOC 822. Moreover, as illustrated in FIG. 8, in one aspect the display 810, the input device 830, the speaker 836, the microphone 838, the wireless antenna 820, and the power supply 844 may be external to the SOC 822. However, each may be coupled to one or more components of the SOC 822, for example through an interface or a controller.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The semiconductor chips are then employed in devices described above.

FIG. 9 depicts a particular illustrative embodiment of an electronic device manufacturing process 900. Physical device information 902 may be received in the manufacturing process 900, such as at a research computer 906. The physical device information 902 may include design information representing at least one physical property of a shared sensing MRAM described in reference to FIGS. 2-4, or as one example alternative, the shared charge dual voltage MRAM 600 described in reference to FIG. 6 or, as another example alternative, any combination thereof. For example, the physical device information 902 may include physical parameters, material characteristics, and structure information that may be entered via a user interface 904 coupled to the research computer 906. The research computer 906 may include a processor 908, such as one or more processing cores, coupled to a computer readable medium such as a memory 910. The memory 910 may store computer readable instructions that are executable to cause the processor 908 to transform the physical device information 902 to comply with a file format and to generate a library file 912.

In a particular embodiment, the library file 912 may include at least one data file including the transformed design information. For example, the library file 912 may include a library of semiconductor devices including any device(s) of the shared sensing MRAM described in reference to FIGS. 2-4, or as one example alternative, the shared charge dual voltage MRAM 600 described in reference to FIG. 6 or, as another example alternative, any combination thereof, that is provided for use with an electronic design automation (EDA) tool 920.

The library file 912 may be used in conjunction with the EDA tool 920 at a design computer 914 including a processor 916, such as one or more processing cores, coupled to a memory 918. The EDA tool 920 may be stored as processor executable instructions at the memory 918 to enable a user of the design computer 914 to design a circuit including shared sensing MRAM described in reference to FIGS. 2-4, or as one example alternative, the shared charge dual voltage MRAM 600 described in reference to FIG. 6 or, as another example alternative, any combination thereof, from the library file 912. For example, a user of the design computer 914 may enter circuit design information 922 via a user interface 924 coupled to the design computer 914. The circuit design information 922 may include design information representing at least one physical property of a shared sensing MRAM described in reference to FIGS. 2-4, or as one example alternative, the shared charge dual voltage MRAM 600 described in reference to FIG. 6 or, as another example alternative, any combination thereof. To illustrate, the circuit design property may include identification of particular circuits and relationships to other elements in a circuit design, positioning information, feature size information, interconnection information, or other information representing a physical property of a semiconductor device.

The design computer 914 may be configured to transform the design information, including the circuit design information 922 to comply with a file format. To illustrate, the file formation may include a database binary file format representing planar geometric shapes, text labels, and other information about a circuit layout in a hierarchical format, such as a Graphic Data System (GDSII) file format. The design computer 914 may be configured to generate a data file including the transformed design information, such as a GDSII file 926 that includes information describing the shared sensing MRAM described in reference to FIGS. 2-4, or as one example alternative, the shared charge dual voltage MRAM 600 described in reference to FIG. 6 or, as another example alternative, any combination thereof.

The GDSII file 926 may be received at a fabrication process 928 to manufacture the shared sensing MRAM described in reference to FIGS. 2-4, or as one example alternative, the shared charge dual voltage MRAM 600 described in reference to FIG. 6 or, as another example alternative, any combination thereof, according to transformed information in the GDSII file 926. For example, a device manufacture process may include providing the GDSII file 926 to a mask manufacturer 930 to create one or more masks, such as masks to be used for photolithography processing, illustrated as a representative mask 932. The mask 932 may be used during the fabrication process to generate one or more wafers 934, which may be tested and separated into dies, such as a representative die 936. The die 936 may include a circuit having one or more devices of the shared sensing MRAM described in reference to FIGS. 2-4, or as one example alternative, the shared charge dual voltage MRAM 600 described in reference to FIG. 6 or, as another example alternative, any combination thereof.

The die 936 may be provided to a packaging process 938 where the die 936 is incorporated into a representative package 940. For example, the package 940 may include at least one semiconductor die, for example a single die 936 or multiple dies, such as a system-in-package (SiP) arrangement. The package 940 may be configured to conform to one or more standards or specifications, such as Joint Electron Device Engineering Council (JEDEC) standards.

Information regarding the package 940 may be distributed to various product designers, such as via a component library stored at a computer 946. The computer 946 may include a processor 948, such as one or more processing cores coupled to a memory 950. A printed circuit board (PCB) tool may be stored as processor executable instructions at the memory 950 to process PCB design information 942 received from a user of the computer 946 via a user interface 944. The PCB design information 942 may include physical positioning information of a packaged semiconductor device on a circuit board, the packaged semiconductor device corresponding to the package 940, the shared sensing MRAM described in reference to FIGS. 2-4, or as one example alternative, the shared charge dual voltage MRAM 600 described in reference to FIG. 6 or, as another example alternative, any combination thereof.

The computer 946 may be configured to transform the PCB design information 942 to generate a data file, such as a GERBER file 952 with data that includes physical positioning information of a packaged semiconductor device on a circuit board, as well as layout of electrical connections such as traces and vias, where the packaged semiconductor device corresponds to the package 940 including the device components to be used in the shared sensing MRAM described in reference to FIGS. 2-4, or as one example alternative, the shared charge dual voltage MRAM 600 described in reference to FIG. 6 or, as another example alternative, any combination thereof. In other embodiments, the data file generated by the transformed PCB design information may have a format other than a GERBER format.

The GERBER file 952 may be received at a board assembly process 954 and used to create PCBs, such as a representative PCB 956, manufactured in accordance with the design information stored within the GERBER file 952. For example, the GERBER file 952 may be uploaded to one or more machines for performing various steps of a PCB production process. The PCB 956 may be populated with electronic components including the package 940 to form a represented printed circuit assembly (PCA) 958.

The PCA 958 may be received at a product manufacture process 960 and integrated into one or more electronic devices, such as a first representative electronic device 962 and a second representative electronic device 964. As an illustrative, non-limiting example, the first representative electronic device 962, the second representative electronic device 964, or both, may be selected from the group of a set top box, music player, video player, entertainment unit, navigation device, communications device, personal digital assistant (PDA), fixed location data unit, and a computer. As another illustrative, non-limiting example, one or more of the electronic devices 962 and 964 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although one or more specific examples described may illustrate remote units according to the teachings of the disclosure, the disclosure is not limited to these exemplary illustrated units. Embodiments of the disclosure may be suitably employed in any device that includes active integrated circuitry including memory and on-chip circuitry for test and characterization.

One or more aspects of the embodiments disclosed with respect to FIGS. 2-4 and/or FIG. 6 may be included at various processing stages, such as within the library file 912, the GDSII file 926, and the GERBER file 952, as well as stored at the memory 910 of the research computer 906, the memory 918 of the design computer 914, the memory 950 of the computer 946, the memory of one or more other computers or processors (not shown) used at the various stages, such as at the board assembly process 954, and also incorporated into one or more other physical embodiments such as the mask 932, the die 936, the package 940, the PCA 958, other products such as prototype circuits or devices (not shown), or any combination thereof. Although various representative stages of production from a physical device design to a final product are depicted, in other embodiments fewer stages may be used or additional stages may be included. Similarly, the process 900 may be performed by a single entity, or by one or more entities performing various stages of the process 900.

FIG. 10 illustrates an exemplary wireless communication system 1000 in which one or more embodiments of the disclosure may be advantageously employed. For purposes of illustration, FIG. 10 shows three remote units 1020, 1030, and 1050 and two base stations 1040. It will be recognized that conventional wireless communication systems may have many more remote units and base stations. The remote units 1020, 1030, and 1050 include semiconductor devices 1025, 1035 and 1055 (including on-chip voltage regulators, as disclosed herein), which are among embodiments of the disclosure as discussed further below. FIG. 10 shows forward link signals 1080 from the base stations 1040 and the remote units 1020, 1030, and 1050 and reverse link signals 1090 from the remote units 1020, 1030, and 1050 to the base stations 1040.

In FIG. 10, the remote unit 1020 is shown as a mobile telephone, the remote unit 1030 is shown as a portable computer, and the remote unit 1050 is shown as a fixed location remote unit in a wireless local loop system. For example, the remote units may be mobile phones, hand-held personal communication systems (PCS) units, portable data units such as personal data assistants, navigation devices (such as GPS enabled devices), set top boxes, music players, video players, entertainment units, fixed location data units such as meter reading equipment, or any other device that stores or retrieves data or computer instructions, or any combination thereof. Although FIG. 10 illustrates remote units according to the teachings of the disclosure, the disclosure is not limited to these exemplary illustrated units. The disclosed device may be suitably employed in any device which includes a semiconductor device with an on-chip voltage regulator.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A magnetic random access memory (MRAM) comprising:
    a resistive memory having a first bank having a plurality of I/Os, and a second bank having another plurality of I/Os, each of the I/Os having an array of resistive memory cells;
    a reference node;
    a read mode switch circuit, configured to selectively switch between a first read mode and a second read mode,
    wherein the first read mode couples a selectable one of the resistive memory cells of a first I/O of the first bank to a first read node, a selectable one of the resistive memory cells of a second I/O of the first bank's plurality of I/Os to a second read node and couples a first two or more of the resistive memory cells of the second bank to the reference node,
    wherein the second read mode couples a selectable one of the resistive memory cells of a first I/O of the second bank's plurality of I/Os to the first read node, a selectable one of the resistive memory cells of a second I/O of the second bank's plurality of I/Os to the second read node and couples a second two or more of the resistive memory cells of the first bank to the reference node,
    wherein one of the first two or more of the resistive memory cells is in the first I/O of the second bank's plurality of I/Os and another of the first two or more of the resistive memory cells is in a second I/O of the second bank's plurality of I/Os, and
    wherein one of the second two or more of the resistive memory cells is in the first I/O of the first bank's plurality of I/Os and another of the second two or more of the resistive memory cells is in the second I/O of the first bank's plurality of I/Os.

2. The MRAM of claim 1, further comprising a reference current source coupled to the reference node, wherein the reference current source is configured to generate a first reference current through the first two or more of the resistive memory cells to generate a reference voltage at the reference node.

3. The MRAM of claim 2, wherein the read mode switch circuit is configured to form, in the first read mode, a plurality of first reference current paths from the reference node to a ground, each of the first reference current paths including a corresponding one of the first two or more resistive memory cells, and to form in the second read mode a plurality of second reference current paths from the reference node to the ground, each of the second reference current paths including a corresponding one of the second two or more resistive memory cells.

4. The MRAM of claim 3, further comprising a first sense amplifier having a reference input coupled to the reference node and having a read input coupled to the first read node, and a second sense amplifier having a reference input coupled to the reference node and having a read input coupled to the second read node.

5. The MRAM of claim 4, wherein the read mode switch circuit is configured to form, in the first read mode, a first read current path from the read input of the first sense amplifier through the selectable one resistive memory cell in the first I/O of the first bank's plurality of I/Os, wherein said first read current path and said first reference current paths have a substantially equal capacitance.

6. The MRAM of claim 1, wherein the one of the first two or more of the resistive memory cells in the first I/O of the second bank's plurality of I/Os is a designated binary 0 reference cell programmed to a state representing a binary 0, and the one of the first two or more of the resistive memory cells in the second I/O of the second bank's plurality of I/Os is a designated binary 1 reference cell programmed to a state representing a binary 1.

7. The MRAM of claim 6, wherein the reference current source is configured to generate the first reference current to generate, when flowing to the binary 0 reference cell in the first I/O of the second bank's plurality of I/Os, concurrent with flowing to the binary 1 reference cell in the second I/O of the second bank's plurality of I/Os, a voltage at the reference node approximately midway between a voltage representing a binary 0 and a voltage representing a binary 1.

8. The MRAM of claim 1, wherein the one of the second two or more of the resistive memory cells is selectable from a row of reference cells in the first I/O of the first bank's plurality of I/Os and the another of the second two or more of the resistive memory cells is selectable from a row of reference cells in the second I/O of the first bank's plurality of I/Os.

9. The MRAM of claim 8, wherein the reference cells in the row of reference cells in the first I/O of the second bank's plurality of I/Os are binary 0 reference cells programmed to a state representing a binary 0, and the reference cells in the row of reference cells in the second I/O of the second bank's plurality of I/Os are binary 1 reference cells programmed to a state representing a binary 1.

10. The MRAM of claim 9, wherein the one of the first two or more of the resistive memory cells in the first I/O of the second bank's plurality of I/Os is a binary 0 reference cell programmed to a state representing a binary 0, and the one of the first two or more of the resistive memory cells in the second I/O of the second bank's plurality of I/Os is a binary 1 reference cell programmed to a state representing a binary 1.

11. The MRAM of claim 10, wherein the reference current source is configured to generate at the reference node, when the read mode switch circuit is in the first read mode and the first reference current is flowing to the binary 0 reference cell in the first I/O of the second bank's plurality of I/Os, concurrent with flowing to the binary 1 reference cell in the second I/O of the second bank's plurality of I/Os, a voltage at the reference node approximately midway between a voltage representing a binary 0 and a voltage representing a binary 1.

12. The MRAM of claim 11, wherein the reference current source is further configured to generate at the reference node, when the read mode switch circuit is in the second read mode and the second reference current is flowing to the binary 0 reference cell in the first I/O of the first bank's plurality of I/Os, concurrent with flowing to the binary 1 reference cell in the second I/O of the first bank's plurality of I/Os, a voltage at the reference node approximately midway between a voltage representing a binary 0 and a voltage representing a binary 1.

13. The MRAM of claim 1, further including a plurality of row decoders and a shared charge dual voltage row driver for the plurality of row decoders, the shared charge dual voltage row driver comprising:
   a first switched driver transistor switchably coupling a common word line feeding the plurality of row decoders to a first voltage rail; and
   a second switched driver transistor switchably coupling the common word line to a second voltage rail.

14. The MRAM of claim 13, further comprising a word line coupled to each of the plurality of row decoders, wherein each word line has an associated word line parasitic capacitance and wherein the common word line includes a common word line parasitic capacitance.

15. The MRAM of claim 1, wherein the MRAM is integrated in at least one semiconductor die.

16. The MRAM of claim 1, further comprising a device, selected from the group consisting of a set top box, music player, video player, entertainment unit, navigation device, communications device, personal digital assistant (PDA), fixed location data unit, and a computer, into which the MRAM is integrated.

17. A method for magnetic random access memory (MRAM) storage, comprising:
   programming a resistive memory cell of a first resistive memory cell array of a first MRAM bank as a first bank designated binary 0 reference cell and a resistive memory cell of a second resistive memory cell array of the first MRAM bank as a first bank designated binary 1 reference cell;
   programming a resistive memory cell of a first resistive memory cell array of a second MRAM bank as a second bank designated binary 0 reference cell and a resistive memory cell of a second resistive memory cell array of the second MRAM bank as a second bank designated binary 1 reference cell;
   generating a reference voltage based on the first bank designated binary 0 reference cell and the first bank designated binary 1 reference cell;
   reading a resistance memory cell of the second MRAM bank based on the reference voltage;
   generating a reference voltage based on the second bank designated binary 0 reference cell and the second bank designated binary 1 reference cell; and
   reading a resistance memory cell of the first MRAM bank based on the reference voltage.

18. The method of claim 17, wherein generating a reference voltage based on the first bank designated binary 0 reference cell and the first bank designated binary 1 reference cell includes coupling the first bank designated binary 0 reference cell and the first bank designated binary 1 reference cell concurrently to a reference node.

19. The method of claim 18, wherein generating the reference voltage based on the first bank designated binary 0 reference cell and the first bank designated binary 1 reference cell further includes generating a reference current flow through the first bank designated binary 0 reference cell and the first bank designated binary 1 reference cell concurrently to the reference node.

20. The method of claim 19, wherein reading the resistance memory cell of the second MRAM bank includes generating a read current flow through said resistance memory cell concurrent with generating the reference current flow.

21. The method of claim 20, wherein said generating the reference voltage based on the second bank designated binary 0 reference cell and the second bank designated binary 1 reference cell further includes uncoupling the first bank designated binary 0 reference cell and the first bank designated binary 1 reference cell from the reference node, and coupling the second bank designated binary 0 reference cell and the second bank designated binary 1 reference cell concurrently to the reference node.

22. A magnetic random access memory (MRAM) storage, comprising:
   means for programming a resistive memory cell of a first resistive memory cell array of a first MRAM bank as a first bank designated binary 0 reference cell and a resistive memory cell of a second resistive memory cell array of the first MRAM memory bank as a first bank designated binary 1 reference cell;
   means for programming a resistive memory cell of a first resistive memory cell array of a second MRAM bank as a second bank designated binary 0 reference cell and a resistive memory cell of a second resistive memory cell array of the second MRAM memory bank as a second bank designated binary 1 reference cell;
   means for generating a reference voltage based on the first bank designated binary 0 reference cell and the first bank designated binary 1 reference cell;
   means reading a resistance memory cell of the second MRAM bank based on the reference voltage;
   means for generating a reference voltage based on the second bank designated binary 0 reference cell and the second bank designated binary 1 reference cell; and
   means for reading a resistance memory cell of the first MRAM bank based on the reference voltage.

23. The MRAM storage of claim 22, wherein the means for generating a reference voltage based on the first bank designated binary 0 reference cell and the first bank designated binary 1 reference cell is configured to couple the first bank designated binary 0 reference cell and the first bank designated binary 1 reference cell concurrently to a reference node.

24. The MRAM storage of claim 23, wherein the means for generating the reference voltage based on the first bank designated binary 0 reference cell and the first bank designated binary 1 reference cell is further configured to generate reference current flow through the first bank designated binary 0 reference cell and the first bank designated binary 1 reference cell concurrently to the reference node.

25. The MRAM storage of claim 24, wherein means for reading the resistance memory cell of the second MRAM bank is configured to generate a read current flow through said resistance memory cell concurrent with generating the reference current flow.

26. The MRAM storage of claim 24, wherein the means for generating a reference voltage based on the second bank designated binary 0 reference cell and the second bank designated binary 1 reference cell is configured to generate the reference voltage based on the second bank designated binary 0 reference cell and the second bank designated binary 1 reference cell, and to uncouple the first bank designated binary 0 reference cell and the first bank binary 1 reference cell from the reference node, and couple the second bank designated binary 0 reference cell and the second bank designated binary 1 reference cell concurrently to the reference node.

27. A method for magnetic random access memory (MRAM) storage, comprising:
   step of programming a resistive memory cell of a first resistive memory cell array of a first MRAM bank as a first bank designated binary 0 reference cell and a resistive memory cell of a second resistive memory cell array of the first MRAM bank as a first bank designated binary 1 reference cell;
   step of programming a resistive memory cell of a first resistive memory cell array of a second MRAM bank as a second bank designated binary 0 reference cell and a resistive memory cell of a second resistive memory cell array of the second MRAM bank as a second bank designated binary 1 reference cell;
   step of generating a reference voltage based on the first bank binary 0 reference cell and the first bank binary 1 reference cell;
   step of reading a resistance memory cell of the second MRAM bank based on the reference voltage;
   step of generating a reference voltage based on the second bank designated binary 0 reference cell and the second bank binary 1 designated reference cell; and
   step of reading a resistance memory cell of the first MRAM bank based on the reference voltage.

28. The method of claim 27, wherein step of generating a reference voltage based on the first bank designated binary 0 reference cell and the first bank binary 1 designated reference cell includes step of coupling the first bank designated binary 0 reference cell and the first bank binary 1 designated reference cell concurrently to a reference node.

29. The method of claim 28, wherein step of generating the reference voltage based on the first bank designated binary 0 reference cell and the first bank binary 1 designated reference cell further includes step of generating a reference current flow through the first bank designated binary 0 reference cell and the first bank designated binary 1 reference cell concurrently to the reference node.

30. The method of claim 29, wherein step of reading the resistance memory cell of the second MRAM bank includes step of generating a read current flow through said resistance memory cell concurrent with generating the reference current flow.

31. The method of claim 30, wherein step of generating the reference voltage based on the second bank designated binary 0 reference cell and the second bank designated binary 1 reference cell further comprises step of generating a reference voltage based on the second bank designated binary 0 reference cell and the second bank designated binary 1 reference cell, wherein said step of generating the reference voltage based on the second bank designated binary 0 reference cell and the second bank designated binary 1 reference cell further includes step of uncoupling the first bank designated binary 0 reference cell and the first bank designated binary 1 reference cell from the reference node, and step of coupling the second bank designated binary 0 reference cell and the second bank designated binary 1 reference cell concurrently to the reference node.

32. A computer product having a computer readable medium comprising instructions that, when read and executed by a processor, cause the processor to:
   program a resistive memory cell of a first resistive memory cell array of a first magnetic random access memory (MRAM) bank as a first bank designated binary 0 reference cell and a resistive memory cell of a second resistive memory cell array of the first MRAM bank as a first bank designated binary 1 reference cell;
   program a resistive memory cell of a first resistive memory cell array of a second MRAM bank as a second bank designated binary 0 reference cell and a resistive memory cell of a first resistive memory cell array of the second MRAM bank as a second bank designated binary 1 reference cell;

control a generation of a reference voltage based on the first bank designated binary 0 reference cell and the first bank designated binary 1 reference cell;

control a read of a resistance memory cell of the second MRAM bank based on the reference voltage;

control a generation of a reference voltage based on the second bank designated binary 0 reference cell and the second bank designated binary 1 reference cell; and control a read of a resistance memory cell of the first MRAM bank based on the reference voltage.

33. The computer product of claim 32 wherein the instructions that when read and executed by a processor, cause the processor to control a generation of a reference voltage based on the first bank binary 0 reference cell and the first bank binary 1 reference cell include instructions that when read and executed by a processor, cause the processor to control a coupling of the first bank binary 0 reference cell and the first bank binary 1 reference cell concurrently to a reference node.

34. The computer product of claim 33 wherein the instructions that when read and executed by a processor, cause the processor to control a generation of a reference voltage based on the first bank binary 0 reference cell and the first bank binary 1 reference cell include instructions that when read and executed by a processor, cause the processor to control a generating of a reference current flow through the first bank binary 0 reference cell and the first bank binary 1 reference cell concurrently to the reference node.

35. The computer product of claim 34 wherein the instructions that when read and executed by a processor, cause the processor to control a read of a resistance memory cell of the first MRAM bank based on the reference voltage further cause a processor to control a generation of a read current flow through said resistance memory cell concurrent with generating the reference current flow.

36. The computer product of claim 35, wherein the instructions that when read and executed by a processor cause the processor to control the generating of the reference voltage based on the second bank designated binary 0 reference cell and the second bank binary 1 designated reference cell include instructions that when read and executed by the processor cause the processor to uncouple the first bank designated binary 0 reference cell and the first bank designated binary 1 reference cell from the reference node, and couple the second bank designated binary 0 reference cell and the second bank designated binary 1 reference cell concurrently to the reference node.

37. The MRAM of claim 1, wherein the first I/O of the first bank's plurality of I/Os and the second I/O of the first bank's plurality of I/Os are identically structured n row by n column arrays of resistive memory cells, and wherein a row of the memory reference cells in the first I/O of the first bank's plurality of I/Os are programmed as designated reference cells, and wherein a row of the memory reference cells in the second I/O of the first bank's plurality of I/Os, different than the row of the memory reference cells in the first I/O of the first bank's plurality of I/Os, are programmed as designated reference cells.

38. The MRAM of claim 1, wherein the first I/O of the first bank's plurality of I/Os includes an n row by m column array of resistive memory cells and logic capable of selectively designating any of the n rows as a row of designated reference cells.

39. The MRAM of claim 38, wherein said logic capable is capable of selecting a designated reference cell from the resistive memory cells of the designated row of reference cells.

40. The MRAM of claim 38, wherein the second I/O of the first bank's plurality of I/Os includes an n row by m column array of resistive memory cells and logic capable of designating any of said n rows as a row of designated reference cells.

* * * * *